(12) United States Patent
Harada et al.

(10) Patent No.: US 7,168,058 B2
(45) Date of Patent: Jan. 23, 2007

(54) PRINTED CIRCUIT WIRING BOARD DESIGNING SUPPORT DEVICE, PRINTED CIRCUIT BOARD DESIGNING METHOD, AND ITS PROGRAM

(75) Inventors: Takashi Harada, Tokyo (JP); Takahiro Yaguchi, Tokyo (JP); Akira Wakui, Tokyo (JP); Seishi Eya, Tokyo (JP); Shunsuke Fujimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/561,195

(22) PCT Filed: Jun. 16, 2004

(86) PCT No.: PCT/JP2004/008763
§ 371 (c)(1),
(2), (4) Date: Dec. 16, 2005

(87) PCT Pub. No.: WO2004/111890

PCT Pub. Date: Dec. 23, 2004

(65) Prior Publication Data
US 2006/0161874 A1     Jul. 20, 2006

(30) Foreign Application Priority Data
Jun. 16, 2003   (JP)   ............................. 2003-170749

(51) Int. Cl.
*G06F 17/50* (2006.01)
(52) U.S. Cl. ............................... 716/15; 716/5; 716/11
(58) Field of Classification Search ...................... None
See application file for complete search history.

(56) References Cited

U.S. PATENT DOCUMENTS 6,496,957 B1 * 12/2002 Kumagai ........................ 716/4
6,546,528 B1 * 4/2003 Sasaki et al. .................. 716/5
6,584,608 B1 * 6/2003 Kumada et al. .............. 716/15
6,691,296 B1 * 2/2004 Nakayama et al. ........... 716/15
6,704,919 B1 * 3/2004 Araki et al. ................... 716/15

FOREIGN PATENT DOCUMENTS

JP     2000-242674      9/2000

OTHER PUBLICATIONS

A. Kamo et al., An Optimization Method for Placement of Decoupling Capacitors on Printed Circuit Board, Proceedings of the IEEE Conference on Electrical Performance of Electronic Packaging, pp. 73 to 76, Oct. 23, 2000, IEEE, USA, p. 76 IV. Conclusion.

* cited by examiner

*Primary Examiner*—Leigh M. Garbowski
(74) *Attorney, Agent, or Firm*—Young & Thompson

(57) ABSTRACT

A printed circuit wiring board designing support device includes a layout data receiving section receiving printed circuit board layout data through an input/output section, a section for extracting structures of power supply/ground planes, a via hole extracting section for extracting a via hole interconnecting the wirings extending over power supply/ground planes, a capacitor extracting section for extracting a capacitor connected between power supply/ground planes, a distance measuring section for measuring the distance between the via hole and the capacitor, a database where the allowable distance value between the via hole and the capacitor in respect to the distance between the power supply and ground planes is recorded, an examination section for comparing the capacitor/via hole distance with the allowable distance value, and a warning section for issuing a warning when the distance between the via hole and the capacitor is larger than the allowable distance value.

30 Claims, 37 Drawing Sheets

PRIOR ART

PRIOR ART

PRIOR ART

PRIOR ART

PRIOR ART

PRIOR ART

CURRENT CHARACTERISTIC

PRINTED CIRCUIT WIRING BOARD DESIGNING SUPPORT DEVICE, PRINTED CIRCUIT BOARD DESIGNING METHOD, AND ITS PROGRAM

TECHNICAL FIELD

The present invention relates to a printed circuit wiring board design supporting device, a printed circuit board design method, and a program of the same, and in particular to a printed circuit wiring board design supporting device, a printed circuit board design method, and a program of the same, in which engineering practice for optimizing the arrangement of a bypass capacitor for controlling circuit malfunction due to unnecessary electromagnetic radiation and noise is improved.

BACKGROUND ART

For the purpose of more adequately describing a technological level for the present invention at present, all descriptions of the patents, patent applications) patent gazettes, scientific papers, and the like which are cited or specified in tho present application will be incorporated herein by reference.

A printed circuit board comprises electronic components such as IC and LSI, and signal wiring for connecting those components, and is mounted on an almost every equipment as the heart of electronic equipment. A multilayer printed circuit board includes a power line composed of aground wiring for providing reference potential of power supply wiring and a circuit for supplying a direct-current voltage required for the IC and the LSI to operate and the potential variation of the power line at high frequency often triggers the generation of IC and LSI malfunction, and high levels of unnecessary electromagnetic wave radiation.

The most commonly adopted technique to control the potential variation of the power line is a method by which a capacitor is mounted on the surface of a board to connect both ends thereof to power supply and ground for absorbing voltage variation.

For example, in a design method of a printed circuit board, a printed circuit board, and electronic equipment provided with a printed circuit board, in order to mount an electronic circuit element on a two-layer printed wiring board 81 in which a printing circuit pattern is formed on a surface (FIG. 1A) and a back surface (FIG. 1B) through an insulated base 80 as shown in FIG. 1A and FIG. 1B, there is adopted structure in which an inductance pattern is formed in a manner that a land is disposed on the surface, a ground pattern 84 up to an inner site of the electronic circuit element is disposed, a trunk power source pattern 82 of a trunk is disposed, a power source branching pattern 83 is branched off from the trunk power source pattern, extended up to the inner site of the electronic circuit element, and connected to a part of the land via a through hole 85, and an inductance formed between the power source branching pattern and the trunk power source pattern is larger than an inductance formed between the power source branching pattern and a capacitor disposed in the vicinity of the power source branching pattern 83. This prior art is disclosed in the Japanese Unexamined Patent Publication No. 9(1997)-54788, Paragraph Number "0032" to "0034," and FIG. 1.

Additionally, as shown in FIG. 2A, FIG. 2B, and FIG. 2C, in power supply pattern connecting structure of an electronic circuit component provided with wiring patterns which are connected to each of both terminals of a power source pin 93 and a ground pin 94 of an LSI 92 mounted on a printed wiring board 91, and which are made up of first power supply patterns 97 and 98, and first ground patterns 99 and 100 for flowing a supply current from a power supply layer (power plane) 95 and a ground layer (ground plane) 96, and a capacitor 101 which is connected to the two wiring patterns and mounted on the same printed circuit board or the back surface thereof as the LSI 92, there is adopted structure in which the power supply layer 95 is connected to a second power supply pattern provided at one end of the capacitor 101 through a via hole 103, and a ground layer is connected to the first ground patterns 99 and 100 through a via hole 104. This prior art is disclosed in the Japanese Unexamined Patent Publication No. 2000-156548, Paragraph Number "0005" and FIG. 1.

Moreover, most printed circuit boards are designed with the use of a CAD (Computer Aided Design) system at present. There is proposed a system that the CAD system is effectively utilized to automatically dispose a capacitor in a design stage of a printed circuit board.

For example, a printed board arranging processor is provided with an input part 111, an arithmetic processing part 112, a data storage part 113, and an arranging processing part 114, as shown in FIG. 3. IC to which a capacitor is to be added is retrieved in an objective IC retrieval part 116 in the arranging processing part 114 based on a capacitor addition condition inputted in a bypass capacitor addition condition input part 115 through the input part 111, and the capacitor is automatically added to the IC retrieved in the objective IC retrieval part 116 based on the capacitor addition condition inputted through the input part 111 in a bypass capacitor automatic addition part 117 only by inputting the condition without a manual operation. This prior art is disclosed in the Japanese Unexamined Patent Publication No. 2000-99560, Paragraph Number "0017" and FIG. 1.

A radiation noise prevention printed board arranging and wiring processing system is also provided with an input/output unit 120, an input part 121, an arithmetic processing part 122, a data storage part 123, and an arranging and wiring processing part 124, as shown in FIG. 4. The arranging and wiring processing part 124 is further provided with an electronic component power source pin extraction part 125 for extracting a power source pin of an electronic component, a wiring pattern extraction part 126 for extracting a wiring pattern from the power source pin to a via hole of a power source, the line length of the extracted wiring pattern, a line length and line width inspection part 127 for inspecting the line length and line width of the extracted wiring pattern, a bypass capacitor addition possibility inspection part 128 for inspecting whether or not the addition of the capacitor is possible, a wiring route change possibility inspection part 129 for inspecting whether or not a wiring route capable of a capacitor addition is present in the case that the capacitor can be added in a present wiring route, a wiring route change execution part 130 for changing the wiring route, a bypass capacitor addition execution part 131, and an error display part 132 for performing error display in the case that the capacitor can not be added even when the wiring route is changed. This prior art is disclosed in the Japanese Unexamined Patent Publication No. 2000-35976, Paragraph Number "0009," "0015," and FIG. 1.

However, with the progress of high-density implementation, a case in which an LSI package and the like requiring high-density wiring called BGA (Ball Grid Array) is increased, leading to difficulty in realizing such mounting structure of the capacitors as shown in FIG. 1A, FIG. 1B, FIG. 2A, FIG. 2B, and FIG. 2C.

Additionally, in a case in which a capacitor is automatically added, it is impossible to determine whether or not the structure is best suited because the relationship between the position at which the capacitor is mounted and unnecessary electromagnetic wave radiation control or circuit malfunction prevention is not clearly defined.

DISCLOSURE OF THE INVENTION

It is an object of the present invention to provide printed circuit board design supporting technology for automatically checking the arrangement of a capacitor for controlling unnecessary electromagnetic wave radiation and circuit malfunction to promote the optimization of a board layout, while maintaining a design approach and the structure of a conventional board.

More specifically, it is an object of the present invention to provide a printed circuit wiring board design supporting device for automatically checking the arrangement of the capacitor for controlling the unnecessary electromagnetic wave radiation and the circuit malfunction to promote the optimization of the board layout, while maintaining the design approach and the structure of the conventional board.

It is another object of the, present invention to provide a printed circuit board design method for automatically checking the arrangement of a capacitor for controlling unnecessary electromagnetic wave radiation and circuit malfunction to promote the optimization of a board layout, while maintaining a design approach and the structure of a conventional board.

It is still another object of the present invention to provide a program for automatically checking the arrangement of a capacitor for controlling unnecessary electromagnetic wave radiation and circuit malfunction to execute a printed circuit board design method for promoting the optimization of a board layout, while maintaining a design approach and the structure of a conventional board.

A first aspect of the gist of the present invention provides, in order to design a printed circuit board including signal wiring, power planes, and ground planes, a printed circuit wiring board design supporting device comprising a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction part for extracting the structure of said power planes and said ground planes, a via hole extraction part for extracting via holes for interconnecting wiring extending at different levels to each other across said power planes and said ground planes, a capacitor extraction part for extracting capacitors connected between said power planes and said ground planes, a measurement part for measuring the distance between said via holes and said capacitors, a distance comparison part for comparing the upper limit of a tolerable distance range between said via holes and said capacitors to measurement distance between said via holes and said capacitors, which is measured by said measurement part, with respect to the spacing between said power planes and said ground planes, and a warning generation part for generating a warning if said measurement distance is larger than the upper limit of said tolerable distance range.

The upper limit of said tolerable distance range, may be displayed as a table, or may be displayed as a mathematical, formula A second aspect of the gist of the present invention provides, in order to design a printed circuit board including signal wiring, power planes, and ground planes, a printed circuit wiring board design supporting device comprising a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction part for extracting the structure of said power planes and said ground planes, a via hole extraction part for extracting via holes for interconnecting wiring extending at different levels to each other across said power planes and said ground planes a capacitor extraction part for extracting capacitors connected between said power planes and said ground planes, a circle creation part for creating a circle with the upper limit of a tolerable distance range between said via holes and said capacitors as a radius centering around said via holes with respect to the spacing between said power planes and said ground planes, a capacitor check part for checking to see if said capacitors are present within said circle, and a warning generation part for generating a warning if the capacitors are riot present within said circle.

A third aspect of the gist of the present invention provides, in order to design a printed circuit board including signal wiring, power planes, and ground planes, a printed circuit wiring board design supporting device comprising a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction part for extracting the structure of said power planes and said ground planes, a via hole extraction part for extracting via holes for interconnecting wiring extending at different levels to each other across said power planes and said ground planes, a capacitor extraction part for extracting capacitors connected between said power planes and said ground planes, a circle creation part for creating a circle with the upper limit of a tolerable distance range between said via holes and said capacitors as a radius centering around said via holes with respect to the spacing between said power planes and said ground planes, a capacitor number check part for counting the number of said capacitors within said circle to compare the counted number thereof to the number of capacitors required for the upper limit of the, tolerable distance range, and a warning generation part for generating a warning if the capacitors within said circle do not meet the required number.

A fourth aspect of the gist of the present invention provides, in order to design a printed circuit board including signal wiring, power planes, and ground planes, a printed circuit wiring board design supporting device comprising a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction part for extracting the structure of said power planes, and said ground planes, a power source pin extraction part for extracting power source pins for an integrated circuit mounted on said printed circuit board, a capacitor extraction part for extracting capacitors connected between said power planes and said ground planes, a measurement part for measuring tie distance between said power source pins and said capacitors, a distance comparison part for comparing measurement distance between said power source pins and said capacitors, which is measured by said measurement part, to the upper limit of a tolerable distance range between said power source pins and said capacitors with respect to the spacing between said power planes and said ground planes, and a warning generation part for generating a warning if said measurement distance is larger than the upper limit of said tolerable distance range.

The upper limit of said tolerable distance range may be displayed as a table, or may be displayed as a mathematical formula.

A fifth aspect of the gist of the present invention provides, in order to design a printed circuit board including signal wiring, power planes, and ground planes, a printed circuit wiring board design supporting device comprising a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction part for extracting the structure of said power planes and said ground planes, a power source pin extraction part for extracting power source pins for an integrated circuit mounted on said printed circuit board, a capacitor extraction part for extracting capacitors connected between said power planes and said ground planes, a circle creation part for creating a circle with the upper limit of a tolerable distance range between said power source pins and said capacitors as a radius centering around said power source pins with respect to the spacing between said power planes and said ground planes, a capacitor check part for checking to see if said capacitors are present within said circle, and a warning generation part for generating a warning if the capacitors are not present within said circle.

A sixth aspect of the gist of the present invention provides, in order to design a printed circuit board including signal wiring, power planes, and ground planes, a printed circuit wiring board design supporting device comprising a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction part for extracting the structure of said power planes and said ground planes, a power source pin extraction part for extracting power source pins for an integrated circuit mounted on said printed circuit board, a capacitor extraction part for extracting capacitors connected between said power planes and said ground planes, a circle creation part for creating a circle with the upper limit of a tolerable distance range between said power source pins and said capacitors as a radius centering around said power source pins with respect to the spacing between said power planes and said ground planes, a capacitor capacitance check part for checking to see if the total of capacitance values of all capacitors present within said circle exceeds a reference value, and a warning generation part for generating a warning if the total of said capacitance values does not exceed said reference value.

A seventh aspect of the gist of the present invention provides, in order to design a printed circuit board including signal wiring, power planes, and ground planes, a printed circuit wiring board design method comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a via hole extraction step of extracting via holes for interconnecting wiring extending at different levels to each other across said power planes and said ground planes, a capacitor extraction step of extracting capacitors connected between said power planes and said ground planes, a measurement step of measuring the distance between said via holes and said capacitors, a distance comparison step of comparing the upper limit of a tolerable distance range between said via holes and said capacitors to measurement distance between said via holes and said capacitors, which is measured by said measurement part, with respect to the spacing between said power planes and said ground planes, and a warning generation part for generating a warning, if said measurement distance is larger than the upper limit of said tolerable distance range.

The upper limit of said tolerable distance range may be displayed as a table, or may be displayed as a mathematical formula.

An eighth aspect of the gist of the present invention provides, in order to design a printed circuit board including signal wiring, power planes, and ground planes, a printed circuit wiring board design method comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a via hole extraction step of extracting via holes for interconnecting wiring extending at different levels to each other across said power planes and said ground planes, a capacitor extraction step of extracting capacitors connected between said power planes and said ground planes, a circle creation step of creating, a circle with the upper limit of a tolerable distance range between said via holes and said capacitors as a radius centering around said via holes with respect to the spacing between said power planes and said ground planes, a capacitor check step of checking to see if, said capacitors are present within said circle, and a warning generation step of generating a warning if the capacitors are not present within said circle.

A ninth aspect of the gist of the present invention provides, in order to design a printed circuit board including signal wiring, power planes, and ground planes, a printed circuit wiring board design method comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a via hole extraction step of extracting via holes for interconnecting wiring extending at different levels to each other across said power planes and said ground planes, a capacitor extraction step of extracting capacitors connected between said power planes and said ground planes, a circle creation step of creating a circle with the upper limit of a tolerable distance range between said via holes and said capacitors as a radius centering around said via holes with respect to the spacing between said power planes and said ground planes, a capacitor number check step of counting the number of said capacitors within said circle to compare the counted number thereof to the number of capacitors required for the upper limit of the tolerable distance range, and a warning generation step of generating a warning if the capacitors within said circle do not meet the required number.

A tenth aspect of the gist of the present invention provides, in order to design a printed circuit board including signal wiring, power planes, and ground planes, a printed circuit wiring board design method comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a power source pin extraction step of extracting power source pins for an integrated circuit mounted on said printed circuit board, a capacitor extraction step of extracting capacitors connected between said power planes and said ground planes, a measurement step of measuring the distance between said power source pins and said capacitors, a distance comparison step of comparing measurement distance between said power source pins and said capacitors, which is measured by said measurement part, to the upper limit of a tolerable distance range between said power source pins and said capacitors with respect to the spacing between said power planes and said ground planes, and a warning generation step of generating a warning if said measurement distance is larger than the upper limit of said tolerable distance range.

The upper limit of said tolerable distance range may be displayed as a table, or may be displayed as a mathematical formula.

An eleventh aspect of the gist of the present invention provides, in order to design a printed circuit board including signal wiring, power planes, and ground planes, a printed circuit wiring board design method comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a power source pin extraction step of extracting power source pins for an integrated circuit mounted on said printed circuit board, a capacitor extraction step of extracting capacitors connected between said power planes and said ground planes, a circle creation step of creating a circle with the upper limit of a tolerable distance range between said power source pins and said capacitors as a radius centering around said power source pins with respect to the spacing between said power planes and said ground planes, a capacitor check step of checking to see if said capacitors are present within said circle, and a warning generation step of generating a warning if the capacitors are not present within said circle.

A twelfth aspect of the gist of the present invention provides, in order to design a printed circuit board including signal wiring, power planes, and ground planes, a printed circuit wiring board design method comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a power source pin extraction step of extracting power source pins for an integrated circuit mounted on said printed circuit board, a capacitor extraction step of extracting capacitors connected between said power planes and said ground planes, a circle creation step of creating a circle with the upper limit of a tolerable distance range between said power source pins and said capacitors as a radius centering around said power source pins with respect to the spacing between said power planes and said ground planes, a capacitor capacitance check step of checking to see if the total of capacitance values of all capacitors present within said circle exceeds a reference value, and a warning generation step of generating a warning if the total of said capacitance values does not exceed said reference value.

A thirteenth aspect of the gist of the present invention provides, in order to design a printed circuit board including signal wiring, power planes, and ground planes, a printed circuit wiring board design program comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a via hole extraction step of extracting via holes for interconnecting wiring extending at different levels to each other across said power planes and said ground planes, a capacitor extraction step of extracting capacitors connected between said power planes and said ground planes, a measurement step of measuring the distance between said via holes and said capacitors, a distance comparison step of comparing the upper limit of a tolerable distance range between said via holes and said capacitors to measurement distance between said via holes and said capacitors, which is measured by said measurement part, with respect to the spacing between said power planes and said ground planes, and a warning generation step of generating a warning if said measurement distance is larger than the upper limit of said tolerable distance range.

The upper limit of said tolerable distance range may be displayed as a table, or may be displayed as a mathematical formula.

A fourteenth aspect of the gist of the present invention provides, in order to design a printed circuit board including signal wiring, power planes, and ground planes, a printed circuit wiring board design program comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a via hole extraction step of extracting via holes for interconnecting wiring extending at different levels to each other across said power planes and said ground planes, a capacitor extraction step of extracting capacitors connected between said power planes and said ground planes, a circle creation step of creating a circle with the upper limit of a tolerable distance range between said via holes and said capacitors as a radius centering around said via holes with respect to the spacing between said power planes and said ground planes, a capacitor check step of checking to see if said capacitors are present within said circle, and a warning generation step of generating a warning if the capacitors are not present within said circle.

A fifteenth aspect of the gist of the present invention provides, in order to design a printed circuit board including signal wiring, power planes, and ground planes, a printed circuit wiring board design program comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a via hole extraction step of extracting via holes for interconnecting wiring extending at different levels to each other across said power planes and said ground planes, a capacitor extraction step of extracting capacitors connected between said power planes and said ground planes, a circle creation step of creating a circle with the upper limit of a tolerable distance range between said via holes and said capacitors as a radius centering around said via holes with respect to the spacing between said power planes and said ground planes, a capacitor number check step of counting the number of said capacitors within said circle to compare the counted number thereof to the number of capacitors required for the upper limit of the tolerable distance range, and a warning generation step of generating a warning if the capacitors within said circle do not meet the required number.

A sixteenth aspect of the gist of the present invention provides in order to design a printed circuit board including signal wiring, power planes, and ground planes, a printed circuit wiring board design program comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a power source pin extraction step of extracting power source pins for an integrated circuit mounted on said printed circuit board, a capacitor extraction step of extracting capacitors connected between said power planes and said ground planes, a measurement step of measuring the distance between said power source pins and said capacitors, a distance comparison step of comparing measurement distance between said power source pins and said capacitors, which is measured by said measurement part, to the upper limit of a tolerable distance range between said power source pins and said capacitors with respect to the spacing between said power planes and said ground planes, and a warning generation step of generating a warning if said measurement distance is larger than the upper limit of said tolerable distance range.

The upper limit of said tolerable distance range may be displayed as a table, or may be displayed as a mathematical formula.

A seventeenth aspect of the gist of the present invention provides, in order to design a printed circuit board including signal wiring, power planes, and ground planes, a printed circuit wiring board design program comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane structure extraction step of extracting the structure of said power planes and said ground planes, a power source pin extraction step of extracting power source pins for an integrated circuit mounted on said printed circuit board, a capacitor extraction step of extracting capacitors connected between said power planes and said ground planes, a circle creation step of creating a circle with the upper limit of a tolerable distance range between said power source pins and said capacitors as a radius centering around said power source pins with respect to the spacing between said power planes and said ground planes, a capacitor check step of checking to see if said capacitors are present within said circle, and a warning generation step of generating a warning if the capacitors are not present within said circle.

An eighteenth aspect of the gist of the present invention provides, in order to design a printed circuit board including signal wiring, power planes, and ground planes, a printed circuit wiring board design program comprising a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board, a plane stricture extraction step of extracting the structure of said power planes and said ground planes, a power source pin extraction step of extracting power source pins for an integrated circuit mounted on said printed circuit board, a capacitor extraction step of extracting capacitors connected between said power planes and said ground planes, a circle creation step of creating a circle with the upper limit of a tolerable distance range between said power source pins and said capacitors as a radius centering around said power source pins with respect to the spacing between said power planes and said ground planes, a capacitor capacitance check step of checking to see if the total of capacitance values of all capacitors present within said circle exceeds a reference values and a warning generation step of generating a warning if the total of said capacitance values does not exceed said reference value.

BRIEF DESCRIPTION OF THE DRAWINGS

FIG. 5B is an equivalent circuit diagram for illustrative of effects of the wiring in FIG. 8A;

BEST MODE FOR CARRYING OUT THE INVENTION

Hereinafter, an embodiment of the present invention will be described with the use of the drawings.

(First Embodiment)

Figure 1A:
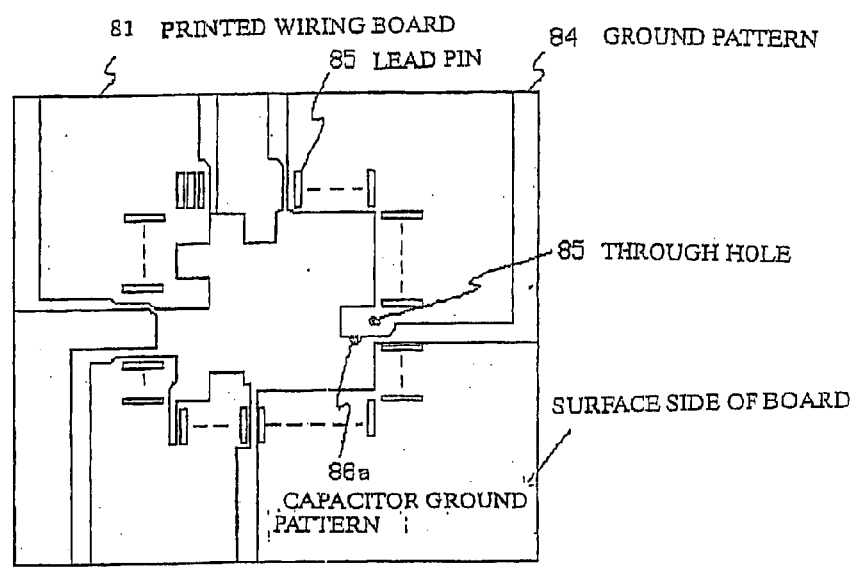
FIG. 1A is a plan view showing the surface side of a printed circuit board designed by the prior art
Figure 1B:
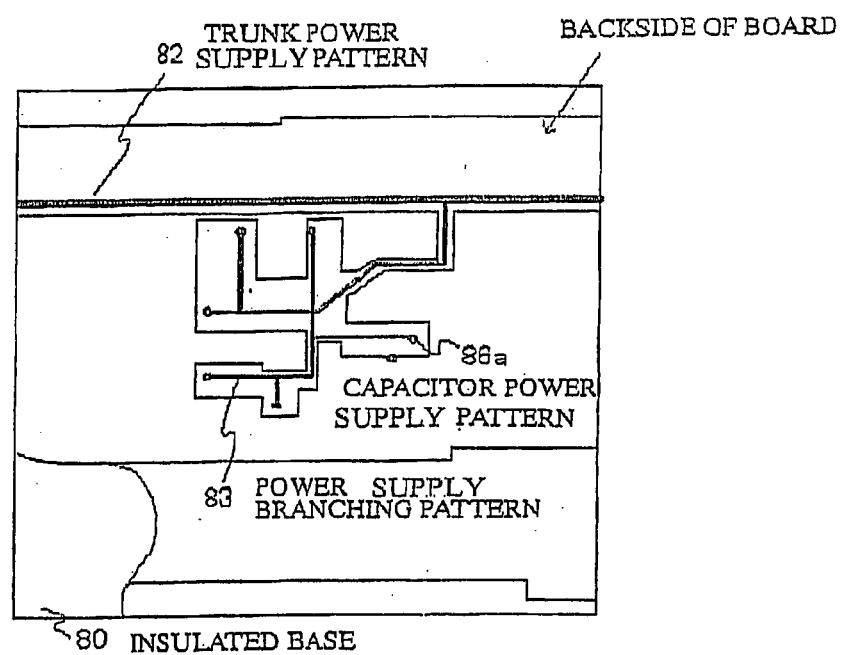
FIG. 1B is a plan view showing the backside of the printed circuit board designed by the prior art.
Figure 2A:
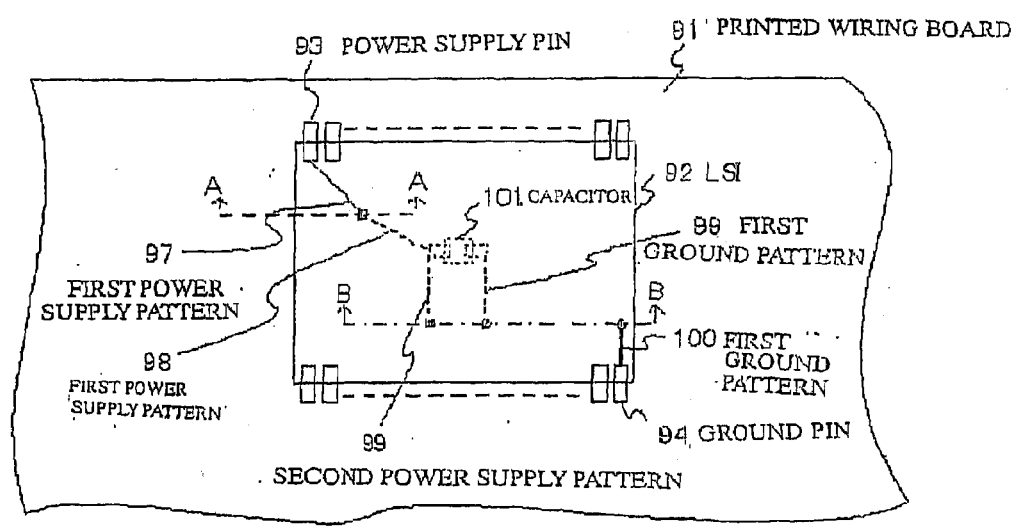
FIG. 2A is a plan view showing power supply pattern connecting structure of an electronic circuit component of a printed circuit board designed by the prior art.
Figure 2B:
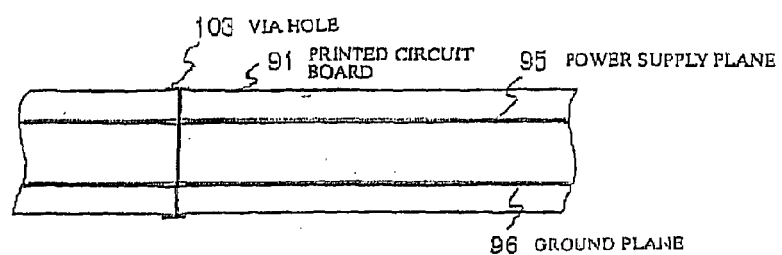
FIG. 2B is a partial longitudinal sectional view taken along the A—A line in FIG. 2A.
Figure 2C:
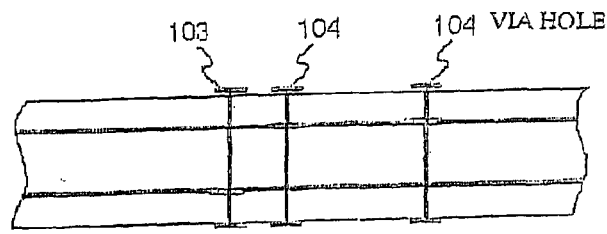
FIG. 2C is a partial longitudinal sectional view taken along the B—B line in FIG. 2A.
Figure 3:
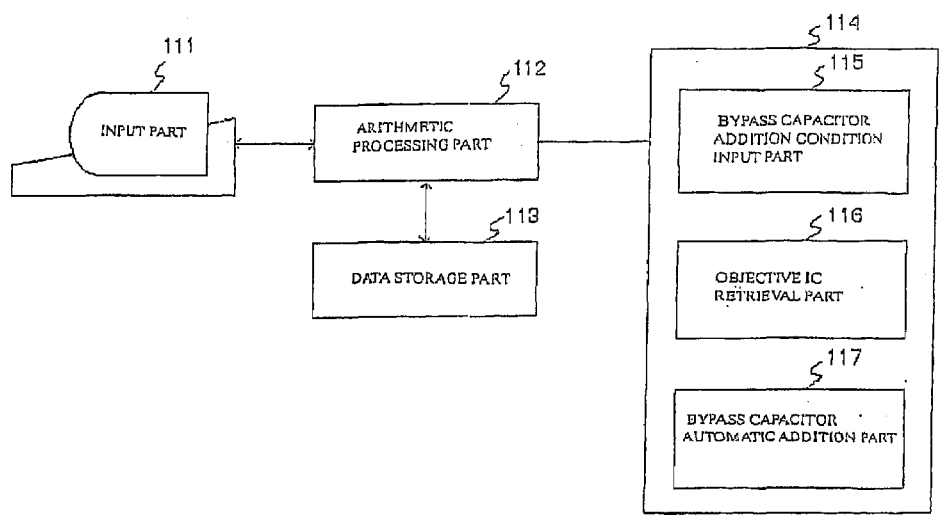
FIG. 3 is a block diagram showing the configuration of a conventional printed board arranging processor.
Figure 4:
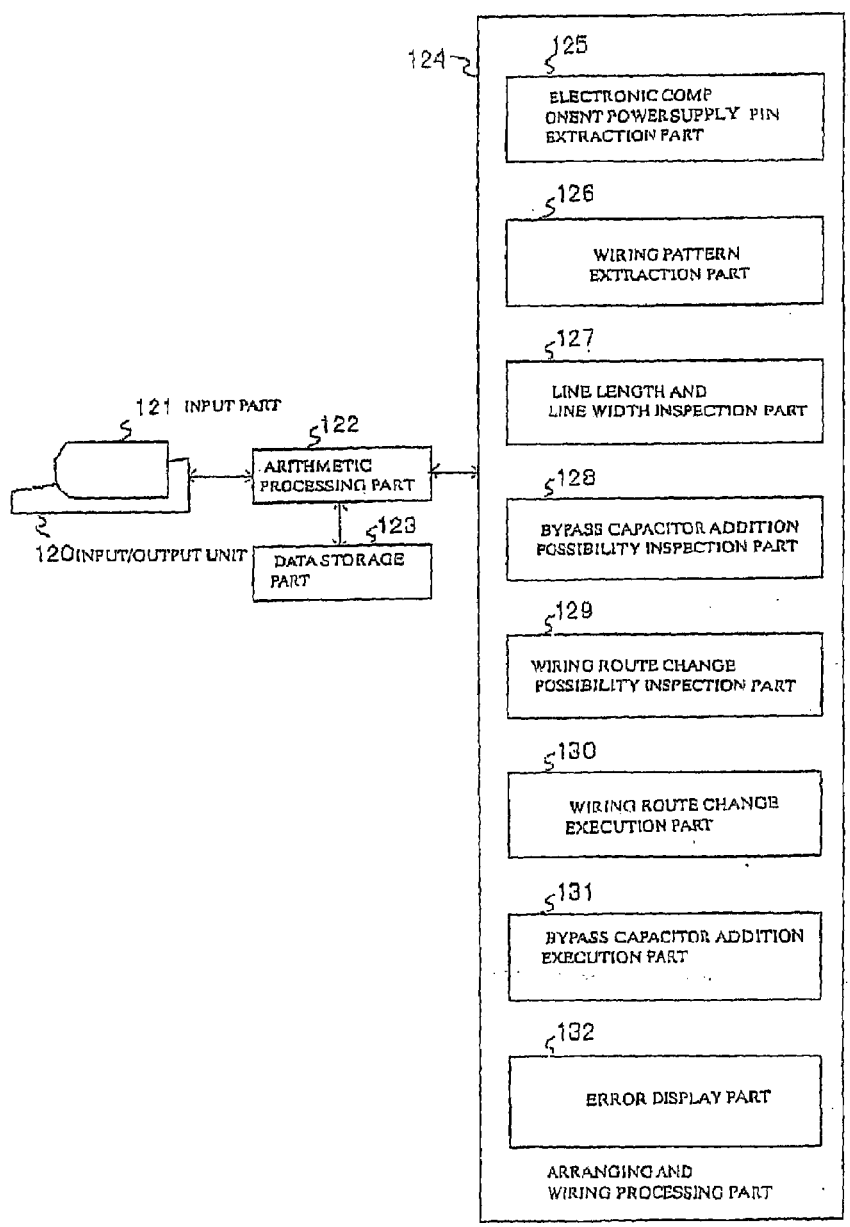
FIG. 4 is a block diagram showing the configuration of a radiation noise prevention printed board arranging and wiring processing system.
Figure 5:
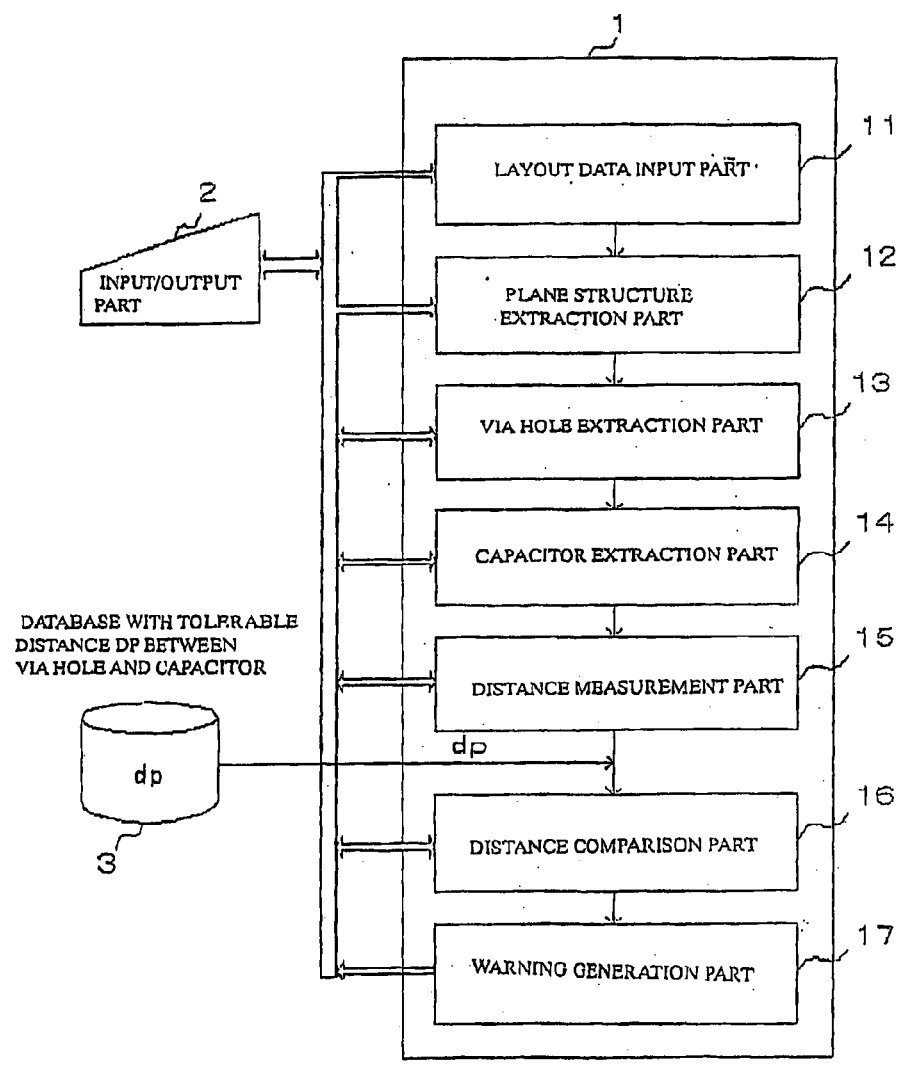
FIG. 5 is a block diagram showing the configuration of a printed circuit wiring board design supporting device in accordance with a first embodiment of the present invention.

A first embodiment of the present invention will be described below. FIG. 5 is a block diagram showing the configuration of a printed circuit wiring board design supporting device in accordance with the first embodiment of the present invention.

Referring to FIG. 5, this printed circuit board design supporting device comprises a control part 1 operating under the control of CPU (not shown), an input/output part 2 provided with a key input part and a display part, and an external storage device 3 for storing a database described later.

The control part 1 includes a layout data input part 11, a plane structure extraction part 12, a via hole extraction part 13, a capacitor extraction part 14, a distance measurement part 15, a database 3, a distance comparison part 16, and a warning generation part 17.

The layout data input part 11 inputs, layout data of a printed circuit board indicating each arrangement position for the case of mounting the structure of signal wiring, power planes, and ground planes, the spacing between the both planes, an active element such as LSI, IC, and a passive element such as a decoupling capacitor on a printed circuit board having the signal wiring, the power planes, and the ground planes through the input/output part 2.

The plane structure extraction part 12 extracts the structure of the power planes and the structure of the ground planes.

The via hole extraction part 13 is intended to extract via holes for connecting between wiring extending at different levels to each other across the power planes and the ground planes, wherein the via holes having interlayer feedthrough structure of a conductor passing through a printed circuit board are extracted.

The capacitor extraction part 14 extracts capacitors connected between the power planes and the ground planes.

The distance measurement part 15 measures the distance between the via holes and the capacitors.

The database 3 is a record of a tolerable distance value between the via holes and the capacitors.

The distance comparison part 16 compares the distance between the via holes and the capacitors to the tolerable distance value recorded in the database 3.

The warning generation part 17 generates a warning if the distance between the via holes and the capacitors is longer than the tolerable distance value therebetween.

Figure 6:
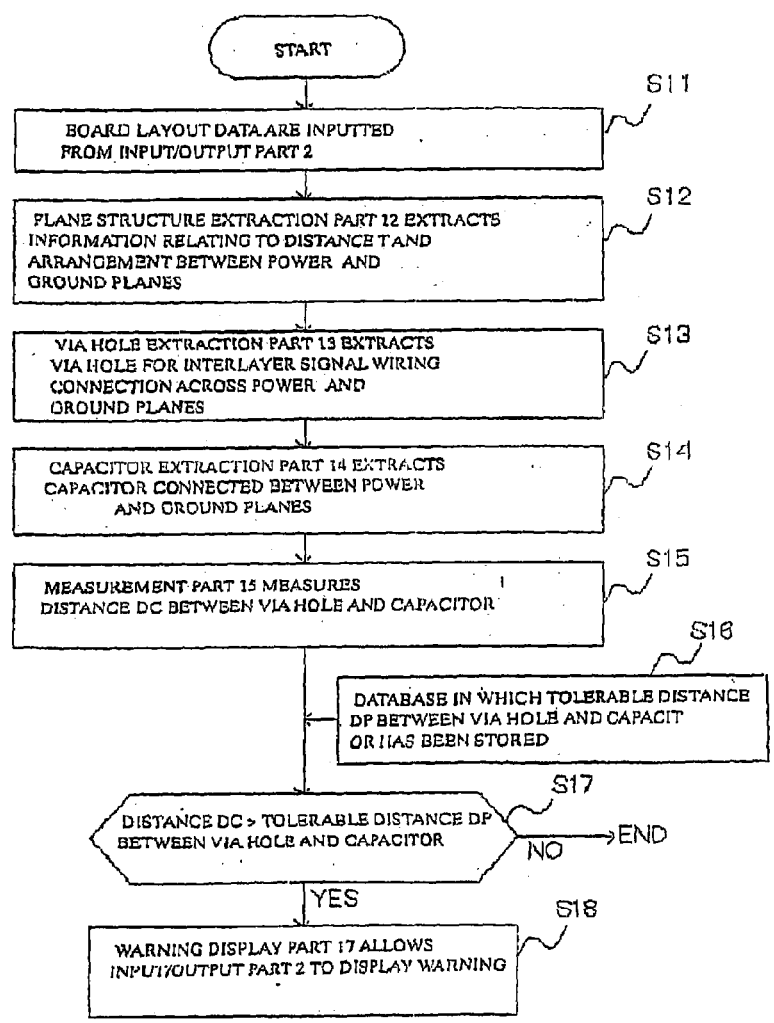
FIG. 6 is a flowchart showing a printed circuit wiring board design method in accordance with a first embodiment of the present invention.
Figure 7:
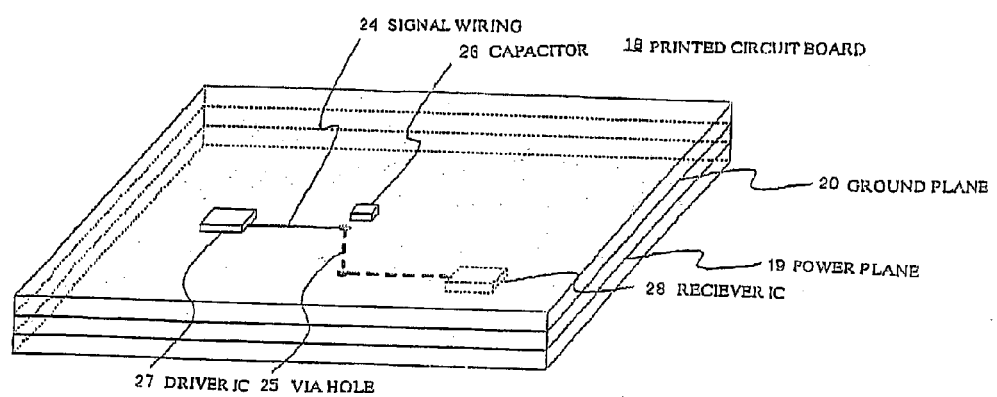
FIG. 7 is a perspective view of a multilayer printed circuit board mounted in accordance with a first embodiment of the present invention.
Figure 8A:
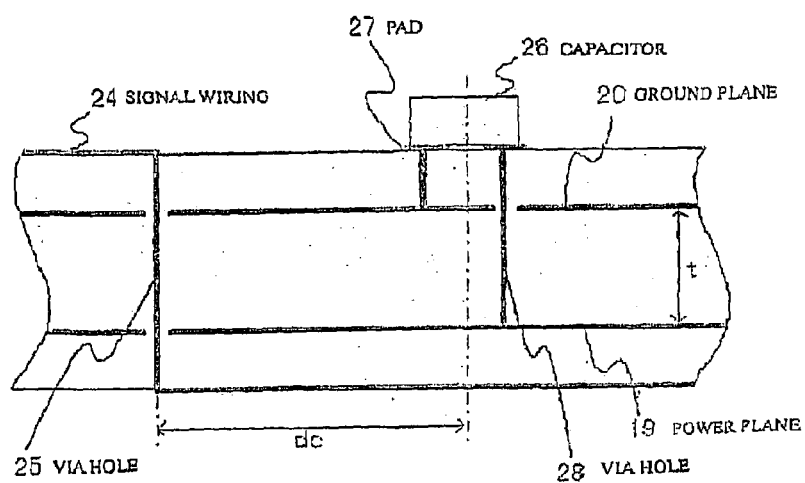
FIG. 8A is a partial longitudinal sectional view of a four-layer printed circuit board having a via hole and a capacitor for connecting between different levels of wiring in accordance with a first embodiment of the present invention.
Figure 8B:
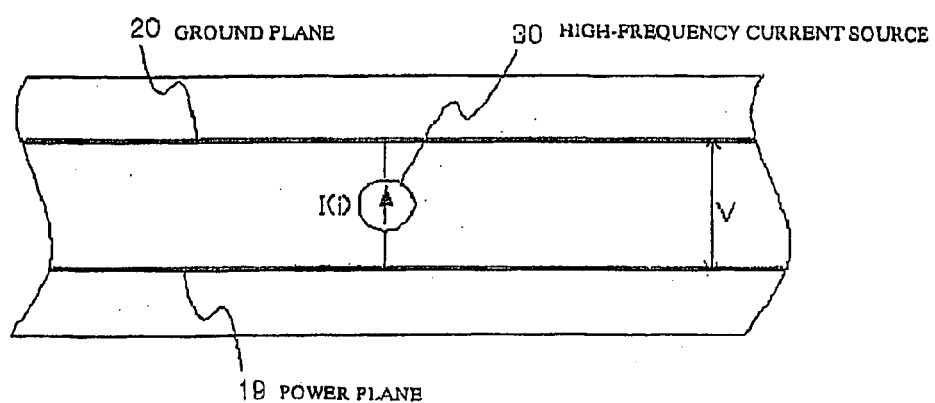

FIG. 6 is a flowchart showing a printed circuit wiring board design method in accordance with the first embodiment of the present invention. FIG. 7 is a perspective view of a multilayer printed circuit board mounted in accordance with the first embodiment of the present invention. FIG. 8A is a partial longitudinal sectional view of a four-layer printed circuit board having via holes and a capacitor for connecting between different levels of wiring in accordance with the first embodiment of the present invention. FIG. 8B is an equivalent circuit diagram for illustrative of effects of the wiring in FIG. 8A.

Position information and each interlayer spacing information relating to the structure of power planes 19 and ground planes 20, a signal wiring 24, via holes 25 which are connected across both of the power planes and the ground planes, capacitors 26 which are connected to both of the power planes and the ground planes and acre disposed close to the via holes, and active elements such as a driver IC 27 and a receiver IC 28 are automatically or manually inputted in the layout data input part 11 of a printed circuit board 18 in FIG. 5 and FIG. 6 (Processing S11).

The plane structure extraction part 12 of the power planes and the ground planes extracts information relating to the distance t and the arrangement between the power planes 19 and the ground planes 20 (Processing S12).

The via hole extraction part 13 for use in an interlayer wiring connection for connecting between different levels of wiring extending across the power planes 19 and the ground planes 20 extracts signal wiring for connecting between the driver IC 27 and the receiver IC 28. If the extracted wiring is laid out over different layers, it is necessary to provide via holes which are conductors in order to pass through these layers for connection, so that information relating to the position at which the via holes are disposed is extracted (Processing S13).

The capacitor extraction part 14 for connecting between the power planes and the ground planes extracts information relating to the position at which the capacitors for connecting between the power planes 19 and the ground planes 20 through capacitor mounting pads 27 and capacitor connection via holes 29 are mounted (Processing S14).

The distance measurement part 15 for measuring the distance between the capacitors 26 and the via holes 25 automatically measures distance dc between the capacitors 26 which are closest to the via holes 25 of all capacitors extracted in the capacitor extraction part 14, and the via holes 25 (Processing S15).

The database 3 in which a tolerable distance value as tolerable distance between the via holes and the capacitors is recorded is a table in which a tolerable distance value dp which is tolerable in the light of an unnecessary electromagnetic wave radiation-controlling effect, and the maximum value of the distance between the via holes 25 and the capacitors 26 is recorded with respect to spacing t between both of the power planes 19 and the ground planes 20.

The distance dc and the tolerable distance value dp between the via holes 25 and the capacitors 26 are compared in the distance comparison part 16 (Processing S16, and Processing S17). In the case of dc>dp, the warning generation part, 17 displays a warning and the reason for generating the warning (Processing S18).

Next, the principle to control the unnecessary electromagnetic wave radiation will be described by making a design of a printed circuit board with the use of the printed circuit wiring board design supporting device in accordance with the present invention.

The via holes 25 for connecting the signal wiring 24 extending at different levels to each other across both of the power planes 19 and the ground planes 20 are known for acting as a high frequency current source 30 as shown in FIG. 8B, and permitting the generation of a high frequency voltage, V between the both planes. This is disclosed in, for example, The General Conference/The Institute of Electronics, Information and Communication Engineers B-4-65, "Coupled model of interlayer wiring and power supply line of multilayer printed circuit board"

This high frequency voltage V propagates within both of the power planes 19 and the ground planes 20, and arrives at end portions of the planes to trigger the generation of the unnecessary electromagnetic wave radiation.

Figure 9A:
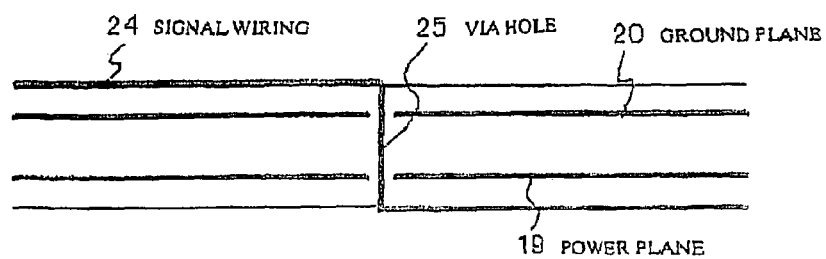
FIG. 9A is a schematic view showing the cross sectional structure of a multilayer printed circuit board having a via hole for connecting different levels of wiring.
Figure 9B:
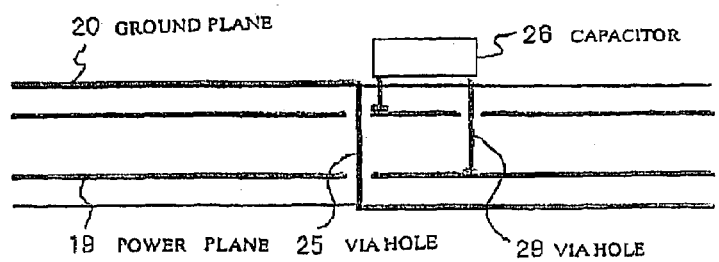
FIG. 9B is a schematic view showing the cross sectional structure of a multilayer printed circuit board having via holes and a capacitor for connecting the different levels of wiring.
Figure 9C:
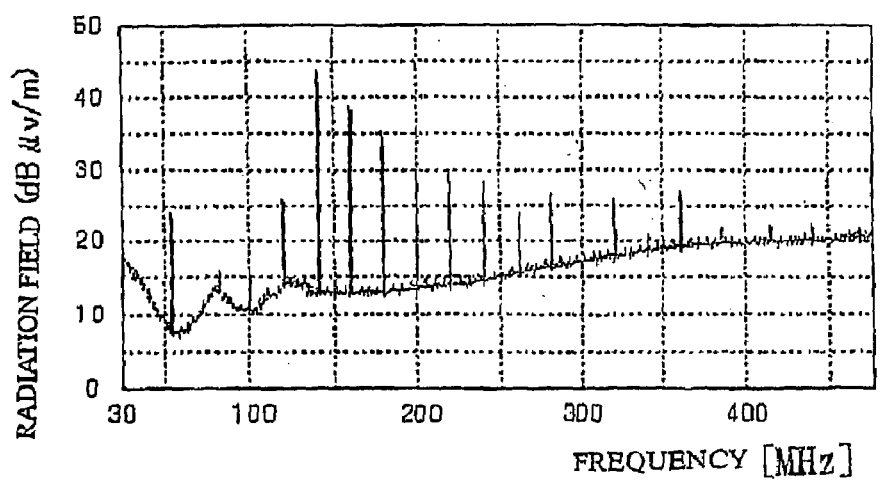
FIG. 9C is a diagram showing an unnecessary electromagnetic wave radiation level in the structure of FIG. 9A.
Figure 9D:
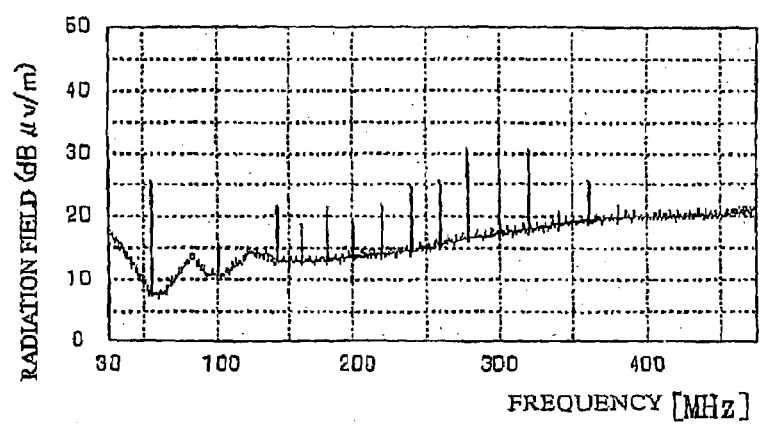
FIG. 9D is a diagram showing an unnecessary electromagnetic wave radiation level in the structure of FIG. 9B.

FIG. 9A is a schematic view showing the cross-sectional structure of a multilayer printed circuit board having a via hole for connecting between different levels of wiring. FIG. 9B is a schematic view showing the cross-sectional structure of a multilayer printed circuit board having via holes and a capacitor for connecting between different levels of wiring. FIG. 9C is a diagram showing an unnecessary electromagnetic wave radiation level in the structure of FIG. 9A. FIG. 9D is a diagram showing an unnecessary electromagnetic wave radiation level in the structure of FIG. 9B.

This radiation may be reduced by disposing the capacitors 26 connected between both of the power planes 19 and the ground planes 20 in the vicinity of the via holes to lower the impedance between the both planes.

In this way, the capacitors 26 require to be disposed close to the via holes 25 for connecting between wiring extending at different levels to each other across both of the power planes 19 and the ground planes 20.

However, when actually trying to mount the capacitors 26, the capacitors 26 cannot be disposed in the proximal to the via holes 25, and are likely to be mounted in a position away from the via holes 25 due to restrictions on the structure of a printed circuit board and component mounting.

However, when the via holes and the capacitors are separated too much, the radiation-controlling effect decreases. Therefore, setting of the distance dc between the via holes and the capacitors is an important element in the design of a printed circuit board.

Figure 10A:
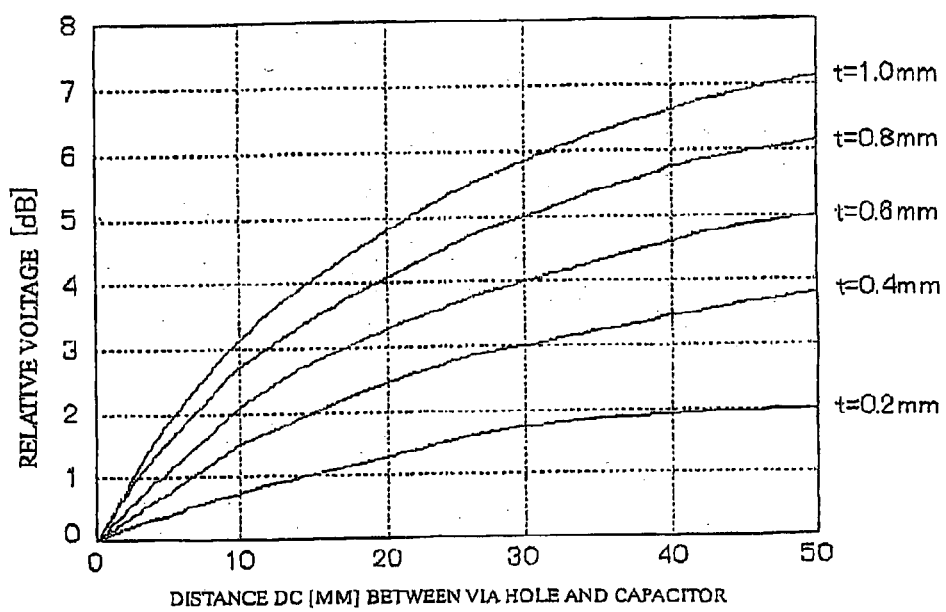
FIG. 10A is a diagram showing a relationship of the distance between a via hole and a capacitor, and a voltage occurring between both of a power plane and a ground plane, with plane spacing as a parameter.
Figure 10B:
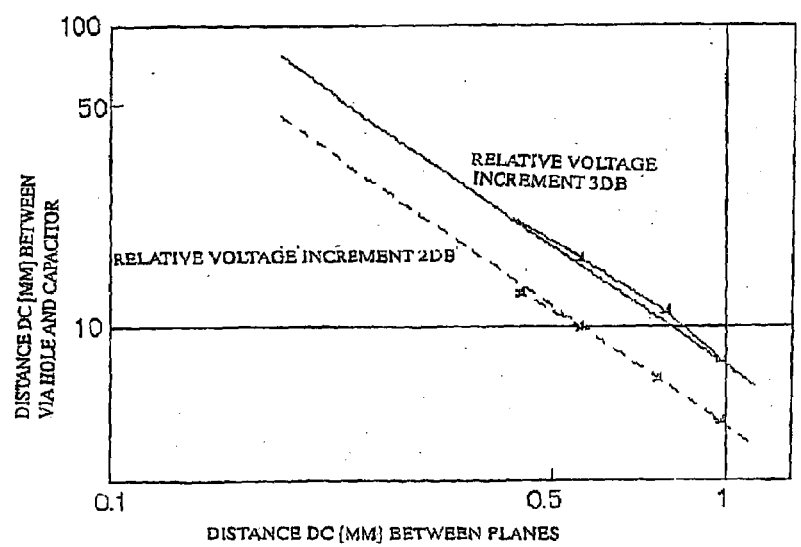
FIG. 10B is a diagram showing a relationship of the spacing between power supply and ground planes, and the distance between a via hole and a capacitor with respect to each tolerable voltage increment.

FIG. 10A is a diagram in which the relationship between the distance between the via holes and the capacitors, and a voltage occurring between both of the power planes and the ground planes is shown with plane spacing as a parameter. FIG. 10B is a diagram in which the relationship between the spacing between the power planes and the ground planes, and the distance between the via holes and the capacitors with respect to each tolerable voltage increment is shown.

FIG. 10A and FIG. 10B reveal that the radiation-controlling effect is dependent on the distance dc between the via holes and the capacitors.

More specifically, voltages in the end portions of a power plane and a ground plane in a specific frequency are calculated with the structure of both of the power plane and the ground plane as a two-dimensional equivalent circuit model, and with the effect of the via holes as a high frequency current source, while changing the position at which a capacitor with a capacitance of 0.01 µF is mounted.

A horizontal axis represents the distance de between the via holes and the capacitors, a vertical axis representing a value by which the voltages between both of the power plane and the ground plane in the ends of the planes are standardized with a voltage value of dc=0, which takes the spacing t between both of the power plane and the ground plane as a parameter.

The intensity of an electromagnetic wave radiated from the power plane and the ground plane is proportional to voltage values in the ends of the planes. This example is disclosed in The Technical Report of the Institute of Electronics, Information and Communication Engineers EMCJ-2001-16, "Application to EMI simulation of LSI power supply terminal current model," in July, 2001.

In general, as the distance dc between the via holes 25 and the capacitors 26 grows larger, a plane voltage V grows higher. The larger the plane spacing, the more significant will be this tendency.

For example, if the plane spacing t is 1 mm, dc is 8 mm, whereas if t is 0.4 mm, dc is 30 mm in terms of the distance dc when the voltage increases by 3 dB (?V=3 dB).

More specifically, the smaller the plane spacing, the longer the distance dc between the via holes and the capacitors allowed. It is possible to show the relationship between a tolerable radiation increment and tolerable distance dp between the via holes and the capacitors in a design stage of a printed circuit board by having a database containing the plane spacing t, the distance dc between the via holes and the capacitors, and a radiation increment ?V. It is possible to provide said database as a table like Table 1 shown below.

In addition, the plane spacing t and the distance dc between the via holes and the capacitors may be represented by a substantially straight line when both axes are expressed as logarithms, and thus may be quantified by such a simple equation as expressed by dc=A×t−B (provided that A and B are constants).

TABLE 1

(Distance dp [mm] between via holes and capacitors to obtain a tolerable voltage increment)

| Plane spacing t | Tolerable voltage increment range | | |
|---|---|---|---|
| | 2 dB | 3 dB | ... |
| t1 | 5 | 8 | . |
| t2 | 7 | 12 | . |
| t3 | 9 | 17 | . |
| . | . | . | . |
| . | . | . | . |
| . | . | . | . |

Figure 11:
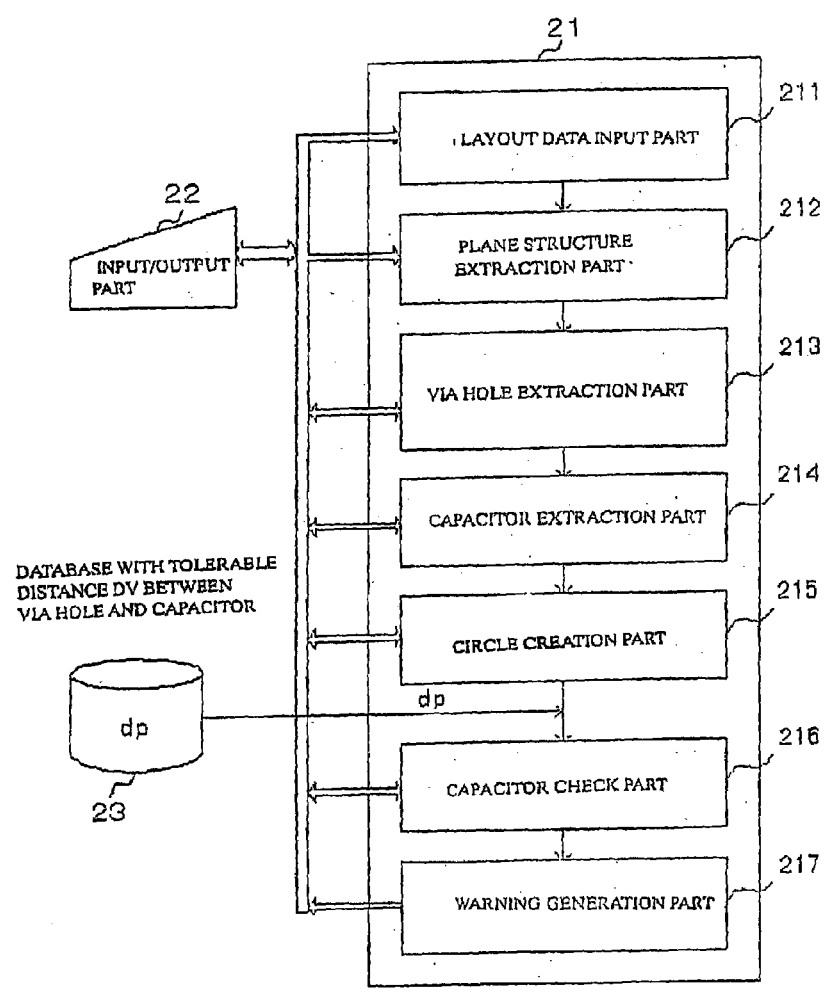
FIG. 11 is a block diagram showing the configuration of a printed circuit wiring board design supporting device in accordance with a first modification of the first embodiment of the present invention.

The principal described above allows an embodiment of the present invention to be realized even in such a configuration as shown in FIG. 11.

Figure 12:
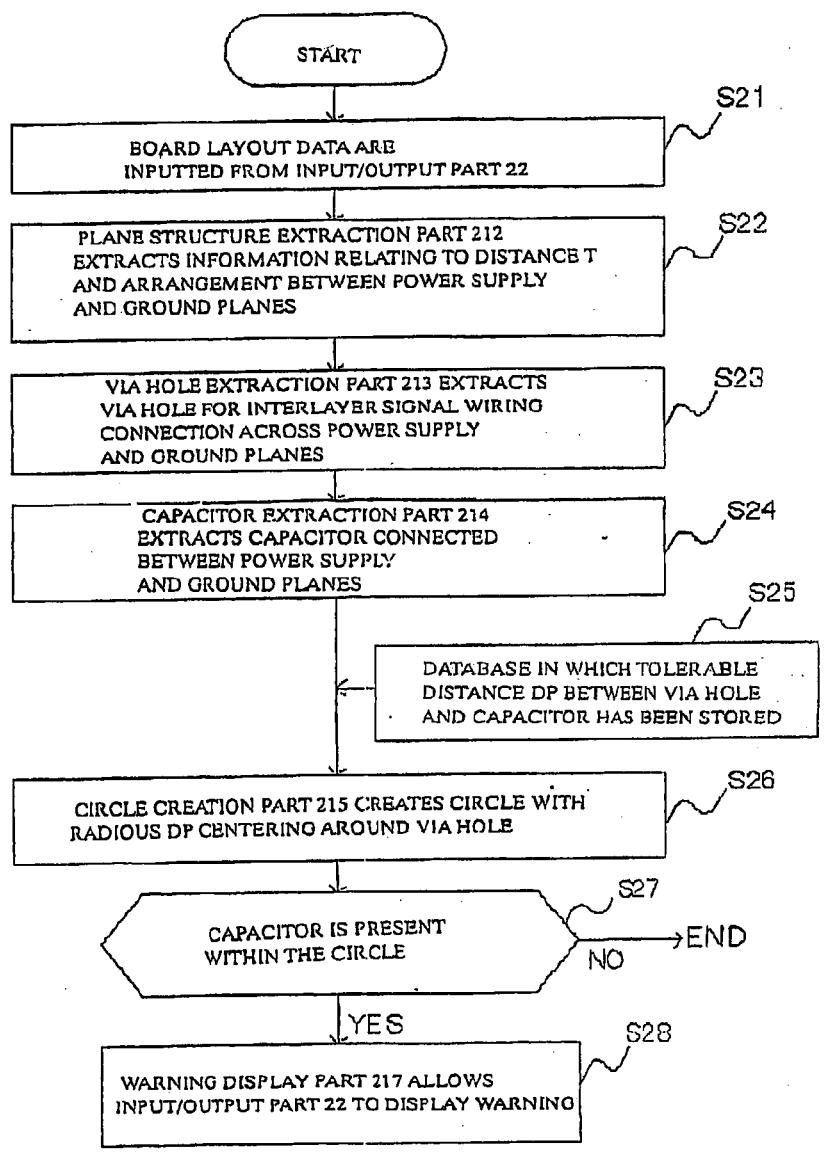
FIG. 12 is a flowchart showing a printed circuit wiring board design method in accordance with a printed circuit wiring board design supporting device having the configuration of FIG. 11.

FIG. 11 is a block diagram showing the configuration of a printed circuit wiring board design supporting device in accordance with a first modification of the first embodiment of the present invention. FIG. 12 is a flowchart showing a printed circuit wiring board design method, in accordance with a printed circuit wiring board design supporting device having the configuration of FIG. 11.

The printed circuit board design supporting device and the printed circuit board design method comprise a control part 21 operating under the control of the CPU (not shown), an input/output part 22 provided with a key input part and a display part, and an external storage device 23 for storing a database described later.

The control part 21 includes a layout data input part 211, a plane structure extraction part 212, a via hole extraction part 213, a capacitor extraction part 214, a circle creation part 215, a capacitor check part 216, and a warning generation part 217.

The layout data input part 211 inputs the layout data of the printed circuit board indicating each arrangement position for the case of mounting the structure of the signal wiring, the power planes, and the ground planes, the spacing between the both planes, the active element such as the LSI, IC, and the passive element such as the decoupling capacitor on the printed circuit board having the signal wiring, the power planes, and the ground planes through the input/output part 22.

The plane structure extraction part 212 extracts the structure of the power planes and the ground planes.

The via hole extraction part 213 is intended to extract via holes for connecting between wiring extending at different levels to each other across the power planes and the ground planes, wherein the via holes having the interlayer feedthrough structure of the conductor passing through the printed circuit board are extracted.

The capacitor extraction part 214 extracts the capacitors 26 connected between the power planes and the ground planes.

The circle creation part 215 has a function to create a circle with a distance of dp outputted from a database 23 as a radius centering around the via holes.

The database 23 is a record of the tolerable distance value between the via holes 25 and the capacitors 26 with respect to the distance between the power planes and the ground planes.

The capacitor check part 216 checks to see if the capacitors 26 are present within the created circle.

The warning generation part 216 has a function to generate a warning if the capacitors 26 are not present within the circle.

Next, a description will be given of details of each component of the printed circuit wiring board design supporting device and its operation. Position information and each interlayer spacing information relating to the structure of the power planes and the ground planes, signal wiring structure, the via holes which are connected across both of the power planes and the ground planes, the capacitors which are connected to both of the power planes and the ground planes and are disposed close to the via holes, and the active elements such as the driver IC and the receiver IC are automatically or manually inputted in the layout data input part 211 of the printed circuit board (Processing S21).

The plane structure extraction part 212 of the power planes and the ground planes extracts information relating to spacing t and the arrangement between power planes 22 and the ground planes 20 (Processing S22).

The via hole extraction part 213 for use in an interlayer wiring connection for connecting between different levels of wiring extending across the power planes 22 and the ground planes 20 extracts the signal wiring 24 for connecting between the driver IC 27 and the receiver IC 28. If the extracted wiring 24 is laid out over different layers, it is necessary to provide via holes which are conductors in order to pass through these layers for connection, so that the information relating to the position at which the via holes are disposed is extracted (Processing S23).

The capacitor extraction part 214 for connecting between the power planes 22 and the ground planes 20 extracts information relating to the position at which the capacitors 26 connected between the power planes 22 and the ground planes 20 through the capacitor mounting pads 27 and the capacitor connection via holes 29 are mounted (Processing S24).

The database 23 in which tolerable distance between the via holes 25 and the capacitors 26 is recorded is a table in which the tolerable distance value dp which is tolerable in the light of the unnecessary electromagnetic wave radiation-controlling effect, and the maximum value of the distance between the via holes 25 and the capacitors 26 is recorded with respect to the spacing t between both of the power planes 22 and the ground planes 20.

Figure 13A:
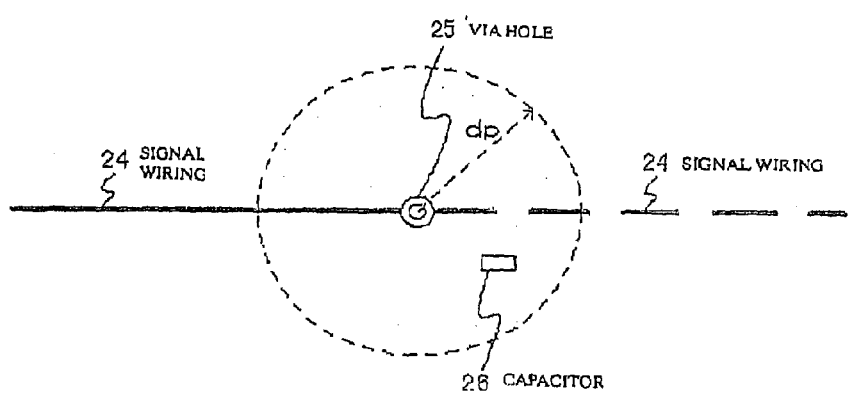
FIG. 13A is a schematic view showing the arrangement of signal wiring, a via hole, and a capacitor on a printed circuit board in accordance with the present invention.
Figure 13B:
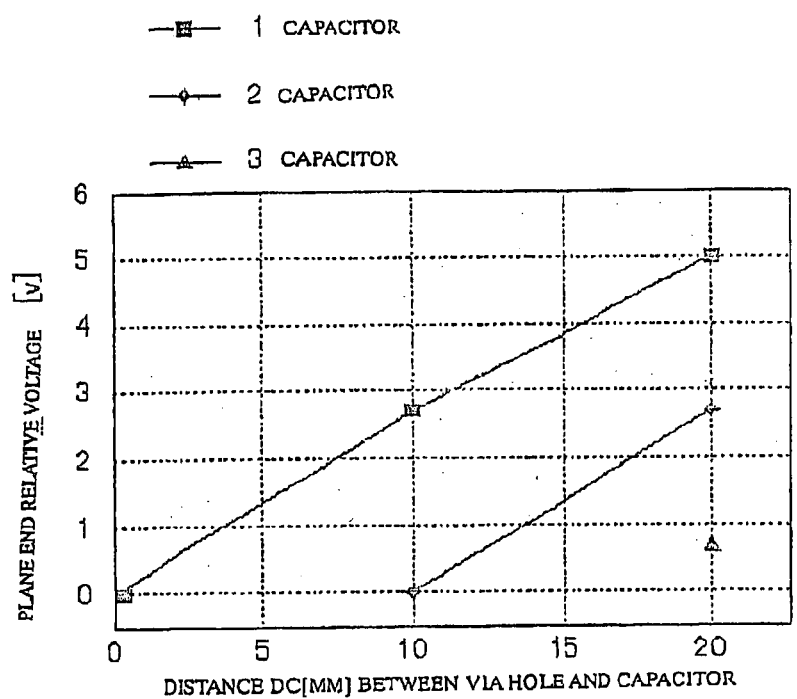
FIG. 13B is a diagram showing a relationship of the distance between the via hole and the capacitor, and a voltage occurring between both of power supply and ground planes when the number of capacitors to be mounted has been changed in FIG. 13A.

FIG. 13A is a schematic view showing the arrangement of the signal wiring, the via hole, and the capacitor on the printed circuit board in accordance with the present invention. FIG. 13B is a diagram showing the relationship between the distance between the via holes and the capacitors, and voltages occurring between both of the power planes and the ground planes when the number of capacitors to be mounted has been changed in FIG. 13A.

The circle creation function 215 creates a board layout drawing with the use of layout data obtained in the layout data input part 211.

On the created drawing, the circle creation function depicts a circle with a tolerable distance value of dp outputted from the database 23 as a radius centering around the via hole 25, as shown in FIG. 13A (Processing S25).

Furthermore, the capacitor check part 216 checks to see if the capacitors are present within the depicted circle (Processing S26). If the capacitors are not present within said circle, a warning and the reason for generating the warning are displayed (Processing S27).

In accordance with the printed circuit wiring board supporting device and the printed circuit board design method, if the capacitors 26 are not present within a circle with a radius of dp centering around the via holes 25, a warning is displayed due to a higher unnecessary electromagnetic wave radiation level.

However, even if the capacitors are not present within the circle with a radius of dp, the radiation level may be controlled by setting a larger radius and mounting a plurality of capacitors therein.

Referring to FIG. 13B, the horizontal axis represents the distance d from the via holes, the vertical axis representing the voltages in the end portions of both of the power planes and the ground plans when one capacitor, two capacitors, and three capacitors are each mounted apart.

More specifically, the voltage levels in the ends of the planes when one capacitor 26 is mounted significantly close to the via hole 25 are substantially equal to that in the case that two capacitors 26 are mounted at a distance of 10 mm from the via holes 25, and that in the case that three capacitors 26 are mounted at a distance of 20 mm from the via holes 25.

It is possible to provide printed circuit board design information taking unnecessary electromagnetic wave radiation into consideration by having a database containing the relationship between distance d up to the via holes 25 and the number of capacitors to have a sufficient effect thereof.

The use of this effect allows such a printed circuit board design supporting device and a printed circuit board design method as will be described below to be realized.

Figure 14:
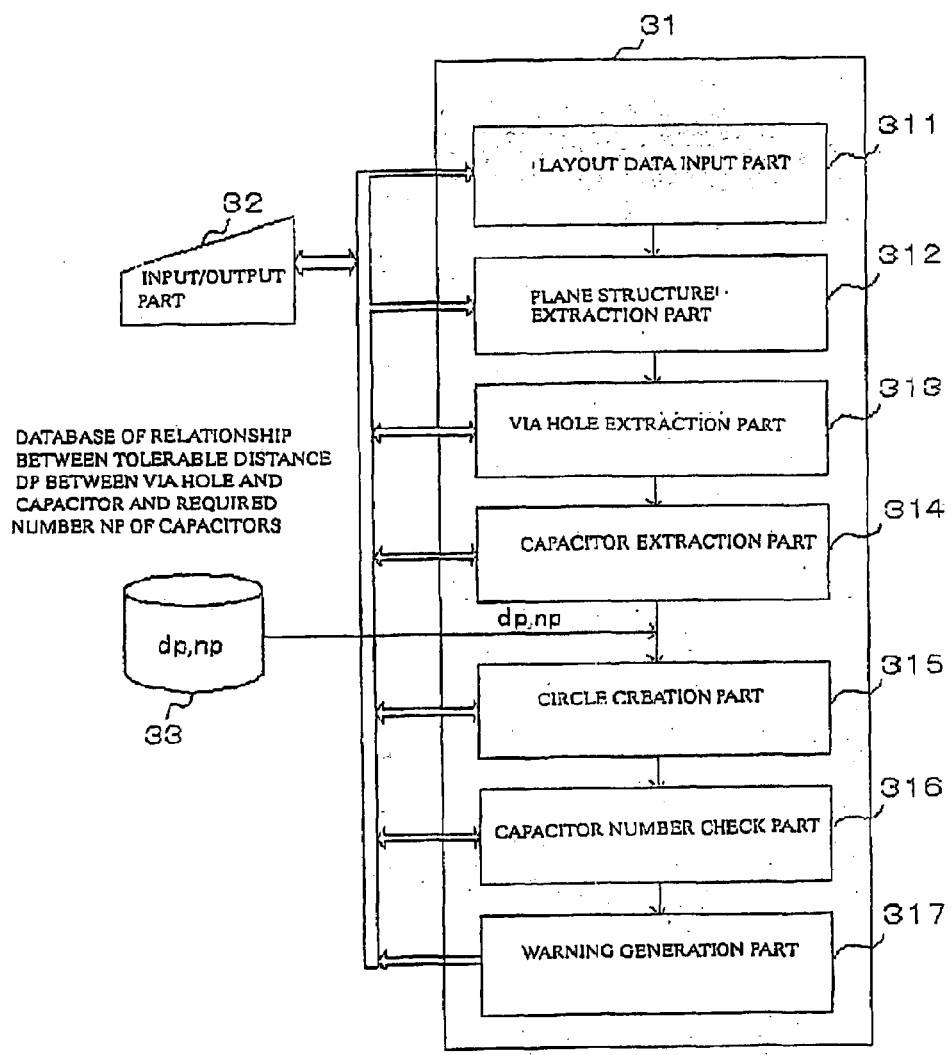
FIG. 14 is a block diagram showing the configuration of a printed circuit wiring board design supporting device in accordance with a second modification of the first embodiment of the present invention.
Figure 15:
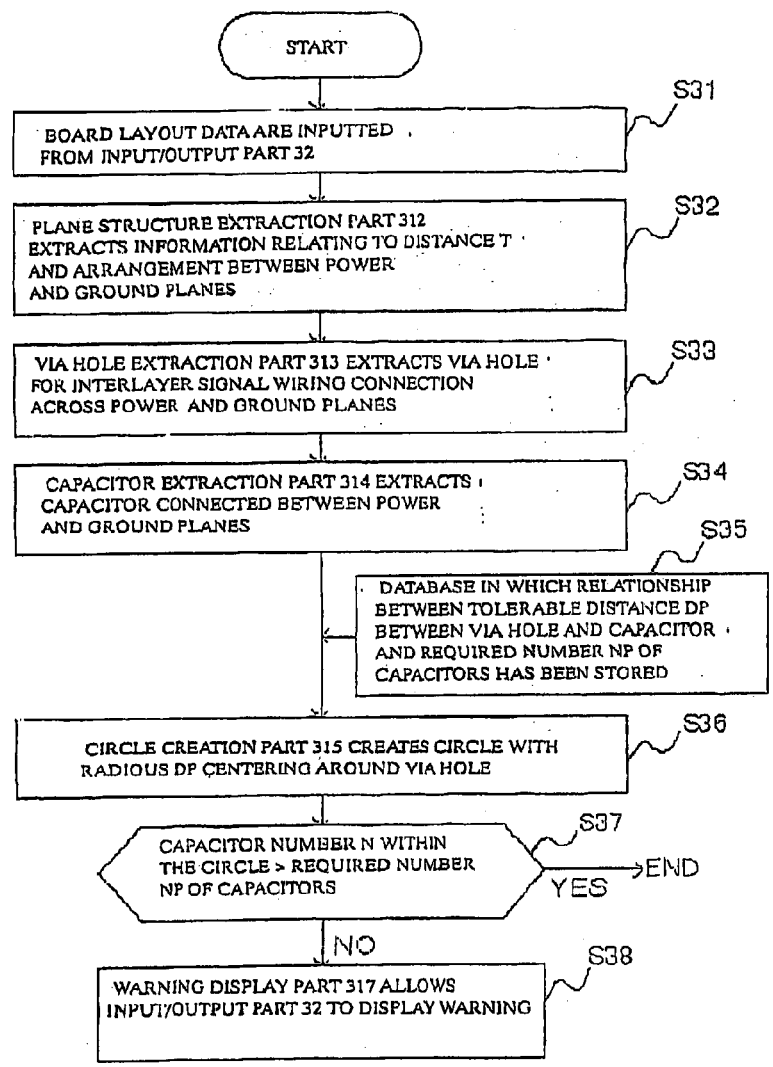
FIG. 15 is a flowchart showing a printed circuit wiring board design method in accordance with a printed circuit wiring board design supporting device having the configuration of FIG. 14.

FIG. 14 is a block diagram showing the configuration of a printed circuit wiring board design supporting device in accordance with a second modification of the first embodiment of the present invention. FIG. 15 is a flowchart showing a printed circuit wiring board design method in accordance with a printed circuit wiring board design supporting device having the configuration of FIG. 14.

This printed circuit wiring board design supporting device comprises a control part, 31 operating under the control of the CPU (not shown), an input/output part 32 provided with a key input part and a display part, an external storage device 33 for storing, a database described later.

The control part 31 includes a layout data input part 311, a plane structure extraction part 312, a via hole extraction part 313, a capacitor extraction part 314, a circle creation part 315, a capacitor number check part 316 and a warning generation part 317.

The layout data input part 311 inputs the layout data of the printed circuit board indicating each arrangement position for the case of mounting the structure of the signal wiring, the power planes, and the ground planes, the spacing between the both planes, the active element such as the LSI, IC, and the passive element such as a decoupling capacitor on the printed circuit board having the signal wiring, the power planes, and the ground planes through the input/output part 32.

The plane structure extraction part 312 extracts the structure of the power planes and the ground planes.

The via hole extraction part 313 is intended to extract via holes for connecting between wiring extending at different levels to each other across the power planes 22 and the ground planes 20, wherein the via holes 25 having the feedthrough structure between the conductor layers passing through the printed circuit board a extracted.

The capacitor extraction part 314 extracts capacitors connected between the power planes 22 and the ground planes 20.

The database 33 is a record of the relationship between the tolerable distance value dp between the via holes 25 and the capacitors 26 and the number np of the capacitors 26 required for the distance thereof with respect to the distance between the power planes 22 and the ground planes 20.

The circle creation part 315 has a function to create a circle with a distance of dp outputted from the database 33 as a radius centering around the via holes 25.

The capacitor number check part 316 checks to see how many capacitors 25 are present within the created circle.

The warning generation part 317 has a function to generate a warning if the capacitors are not present within the circle.

Next, a description will be given of details of each component of the printed circuit wiring board design supporting device and its operation with reference to FIG. 7, FIG. 8A, and FIG. 8B together.

Position information and each interlayer spacing information relating to the structure of the power planes 22 and the ground planes 20, the signal wiring structure, the via holes 25 for connecting different levels of wiring extending across both of the power planes 22 and the ground planes 20, the capacitors 26 which are connected to both of the power planes 22 and the ground planes 20, and are disposed close to the via holes 25, and the active elements such as the driver IC and the receiver IC ire automatically or manually inputted in the layout data input part 311 of the printed circuit board (Processing S31).

The plane structure extraction part 312 of the power planes and the ground planes extracts the information relating to the spacing t and the arrangement between the power planes 22 and the ground planes 20 (Processing S32).

The via hole extraction part 313 for use in the interlayer wiring connection for connecting between different levels of wiring extending across the power planes 22 and the ground planes 20 extracts the signal wiring 24 for connecting between the driver IC 27 and the receiver IC 28.

If the extracted wiring 24 is laid out over different layer levels, it is necessary to provide the via holes 25 which are conductors, in order to pass through these different levels of layers for interconnection, so that the information relating to the position at which the via holes are disposed is extracted (Processing S33).

The capacitor extraction part 314 for connecting between the power planes 22 and the ground planes 20 extracts the information relating to the position at which the capacitors 26 for connecting between the power planes 22 and the ground planes 20 through the capacitor mounting pads 27 and the capacitor connection via holes 29 are mounted (Processing S34).

As described above, the database 33 is a table in which the relationship between the tolerable distance value dp which is tolerable in the light of the unnecessary electromagnetic wave radiation-controlling effect, and the maximum value of the distance between the via holes 25 and the capacitors 26, and the number np of the capacitors 26 required for the distance is recorded with respect to the spacing t between both, of the power planes 22 and the ground planes 20. With reference to the database, the circle creation function 315 creates a board layout drawing with the use of layout data obtained in the layout data input part 311.

On the created drawing, the circle creation function depicts a circle with a tolerable distance value of dp outputted from the database 33 as a radius centering around the via holes 25, as shown in FIG. 13A (Processing S35).

Furthermore, the capacitor number check part 316 checks to see if the capacitors 26 are present within the depicted circle, and further checks to see how many capacitors 26 are present (Processing S36). As a result of the check, if the capacitors 26 are not present within said circle, and if the number np of the required capacitors is not satisfied, a warning and the reason for generating the warning are displayed (Processing S37).

In accordance with the printed circuit board supporting device and the printed circuit board design method, if the required number np within the circle with a radius of dp centering around the via holes 25 is not satisfied, namely, the number n within the circle is not more than the number np, a warning is displayed due to a higher unnecessary electromagnetic wave radiation level.

However, even if the required capacitors are not present within the circle with a radius of dp, the radiation level may be controlled by setting a larger radius and mounting a plurality of capacitors therein.

(Second Embodiment)

Next, a second embodiment of the present invention will be described.

Figure 16:
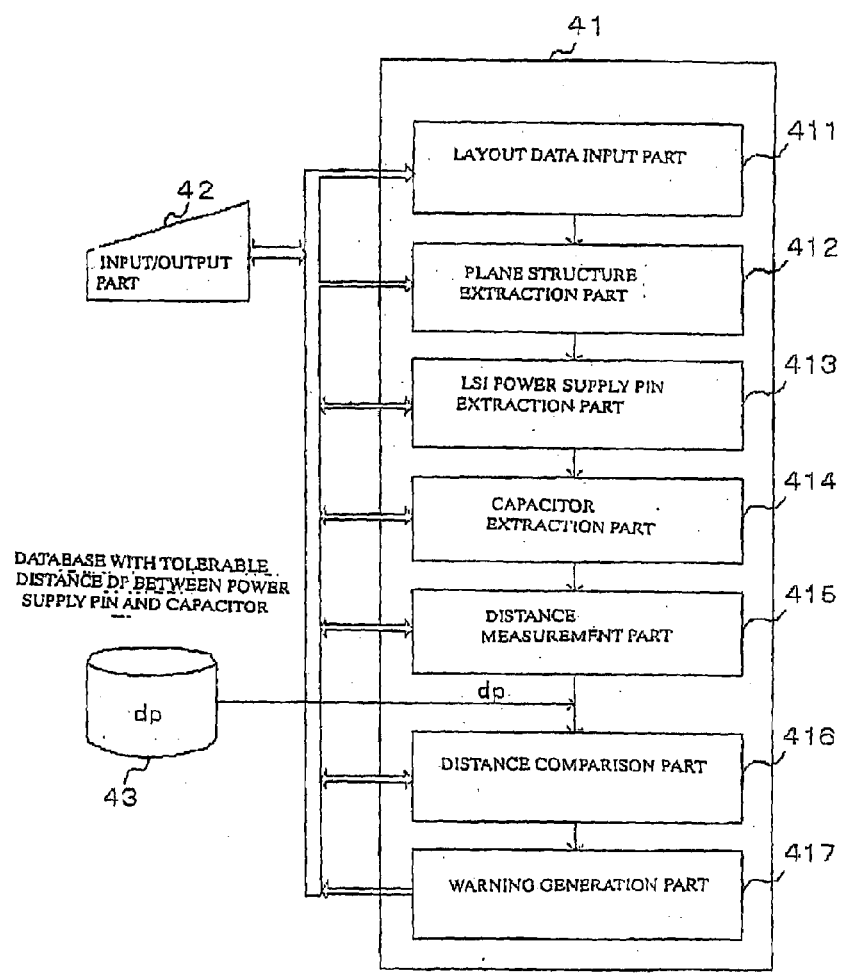
FIG. 16 is a block diagram showing the configuration of a printed circuit wiring board design supporting device in accordance with a second embodiment of the present invention.
Figure 17:
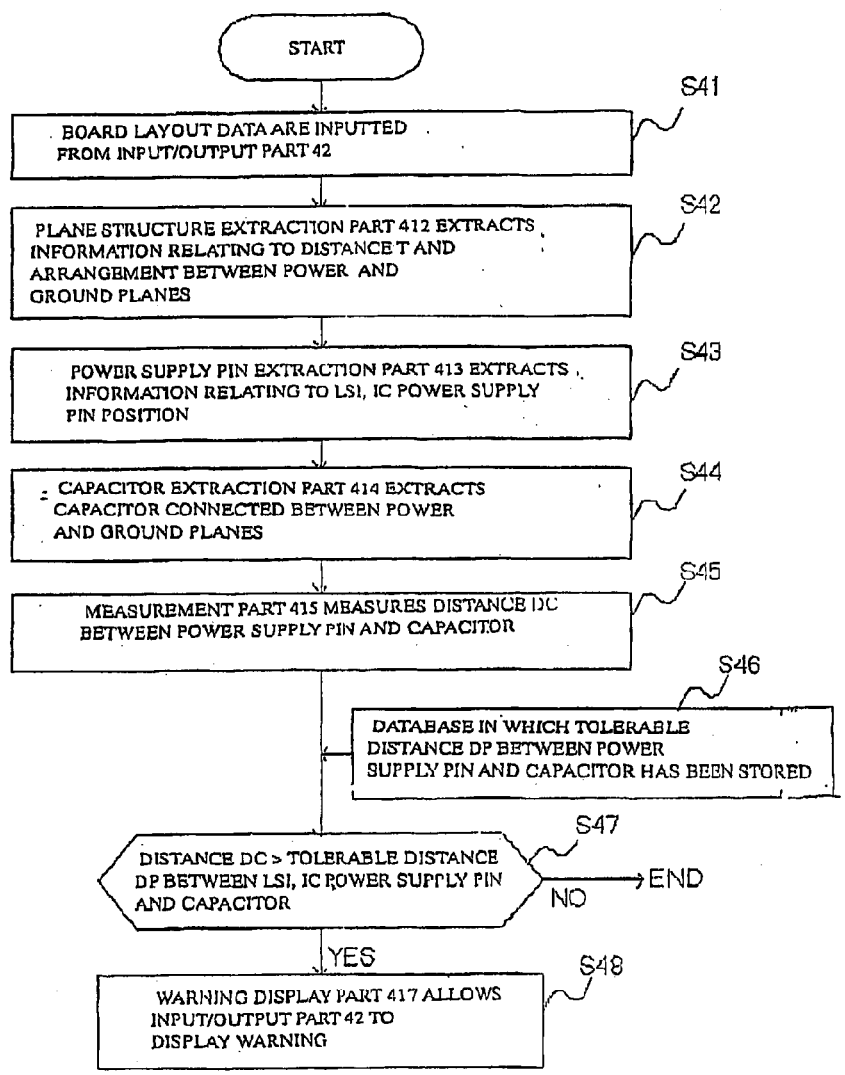
FIG. 17 is a flowchart showing a printed circuit wiring board design method in accordance with a printed circuit wiring board design supporting device having the configuration of FIG. 16.
Figure 18A:
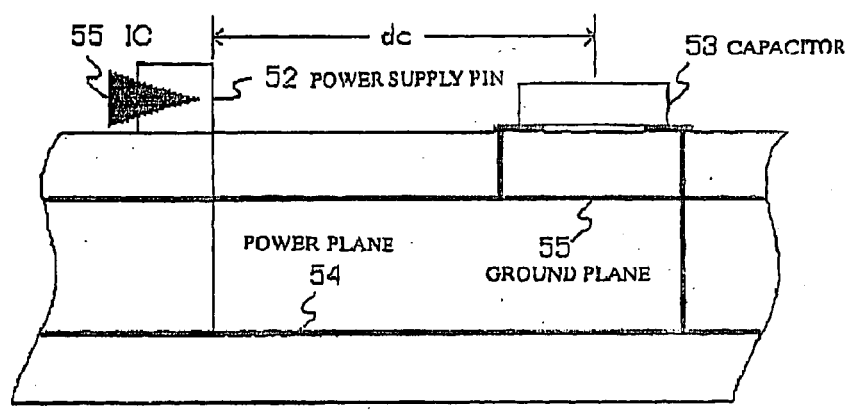
FIG. 18A is a partial longitudinal sectional view of a four-layer printed circuit board having a via hole and a capacitor for connecting between different levels of wiring in accordance with a second embodiment of the present invention.
Figure 18B:
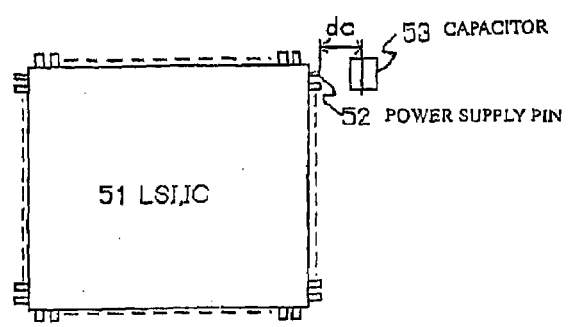
FIG. 18B is a diagram showing a relationship of LSI, a power source pin, and the capacitor in FIG. 18A.
Figure 18C:
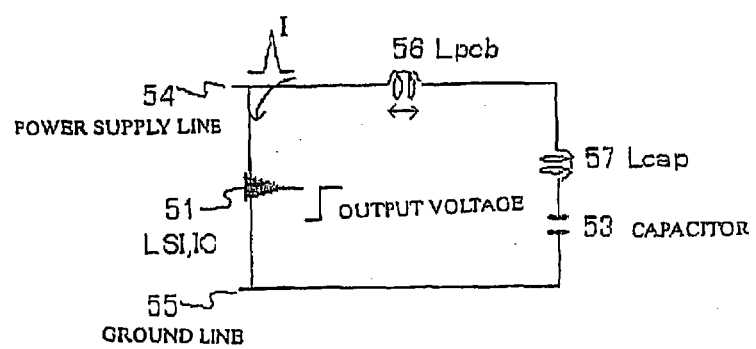
FIG. 18C is an equivalent circuit diagram showing a relationship of the LSI, a power plane, a ground plane, and the capacitor of the printed circuit board in FIG. 18A.

FIG. 16 is a block diagram showing the configuration of a printed circuit wiring board design supporting device in accordance with the second embodiment of the present invention. FIG. 17 is a flowchart showing a printed circuit wiring board design method in accordance with a printed circuit wiring board design supporting device having the configuration of FIG. 16. FIG. 18A is a partial longitudinal sectional view of a four-layer printed circuit board having a via hole and a capacitor for connecting between different levels of wiring in accordance with the second embodiment of the present invention. FIG. 18B is a diagram showing the relationship between LSI, the power source pin, and the capacitor in FIG. 18A. FIG. 18C is an equivalent circuit diagram of the power plane, the ground plane, the LSI, and the capacitor of the printed circuit board in FIG. 18A.

This printed circuit wiring board design supporting device comprises a control part 41 operating under the control of CPU (not shown), an input/output part 42 provided with a key input part and a display part, an external storage device 43 for storing a database described later.

The control part 41 includes a layout data input part 411, a plane structure extraction part 412, a power source pin extraction part 413 of LSI, a capacitor extraction part 414, a distance measurement part 415 between capacitors, a database 43, a distance comparison part 416, and a warning generation part 417.

The layout data input part 411 inputs layout data of a printed circuit board indicating each arrangement position for the case of mounting the structure of signal wiring, power planes, and ground planes, the spacing between the both planes, an active element such as LSI, IC, and a passive element such as a decoupling capacitor on a printed circuit board having a signal wiring 24, power planes 54, and ground planes 55 through the input/output part 42.

The plane structure extraction part 412 extracts the structure of the power planes 54 and the ground planes 55.

The power source pin extraction part 413 of the LSI extracts information relating to the position of power source pins 52.

The capacitor extraction part 414 extracts capacitors 53 connected between the power planes 54 and the ground planes 55.

The distance measurement part 415 measures distance dc between the power source pins 52 of an LSI 5I and the capacitors 53.

The database 43 is a record of a tolerable distance value dp between the power source pins 52 of the LSI 51 and the capacitors 53.

The distance comparison part 416 compares the distance between the power source pins 52 of the LSI 51 and the capacitors 53, to a tolerable distance value dp recorded in the database 43.

The warning generation part 417 generates a warning in case that the distance between the power source pins 52 of the LSI and the capacitors 53 is larger than the tolerable distance value dp.

Next, a description will be given of each component of the present printed circuit wiring board design supporting device, and its details. In FIG. 16, FIG. 17, FIG. 18A, FIG. 18B, and FIG. 18C, position information and each interlayer spacing information relating to the structure of the power planes 54 and the ground planes 55, the capacitors 53 which are connected to both of the power planes and the ground planes, and are disposed close to the via holes, and an active element such as LSI, IC 51 are automatically or manually inputted in the layout data input part 411 of the printed circuit board (Processing S41).

The plane structure extraction part 412 of the power planes and the ground planes extracts information relating to distance t and the arrangement between the power planes 54 and the ground planes 55 (Processing S42).

The power source pin extraction part 413 of the LSI 51 extracts information relating to the position of the power source pins 52 of each pin of the LSI, IC 51 (Processing S43).

The capacitor extraction part 414 between the power planes and the ground planes extracts information relating to the position at which the capacitors 53 connected between the power planes 54 and the ground planes 55 through capacitor mounting pads and capacitor connection via holes are mounted (Processing S44).

The distance measurement part 415 between the power source pins and the capacitors automatically measures distance dc up to the capacitor 53 which is closest to the power source pins 52 among the power source pins 52 and the capacitors 53 extracted in the capacitor extraction part 414 (Processing S45).

The database 43 is a table in which a tolerable distance value dp which is the maximum value of the distance between the power source pins 52 and the capacitors 53 in which power supply voltage variation is not more than a regulation range is recorded with respect to spacing t between both of the power planes 54 and the ground planes 55.

With reference to the database 43, the distance comparison part 416 compares distance dc and a tolerable distance value dp between the power source pins 52 and the capacitors 53 (Processing S46, and Processing S47). In the case of dc>dp, the warning generation part 417 displays a warning and the reason for generating the warning (Processing S48).

Next, a description will be given of a reason that the printed circuit board design device in accordance with the present embodiment may provide a printed circuit board for supplying stable power supply where the power supply variation is controlled.

Figure 19:
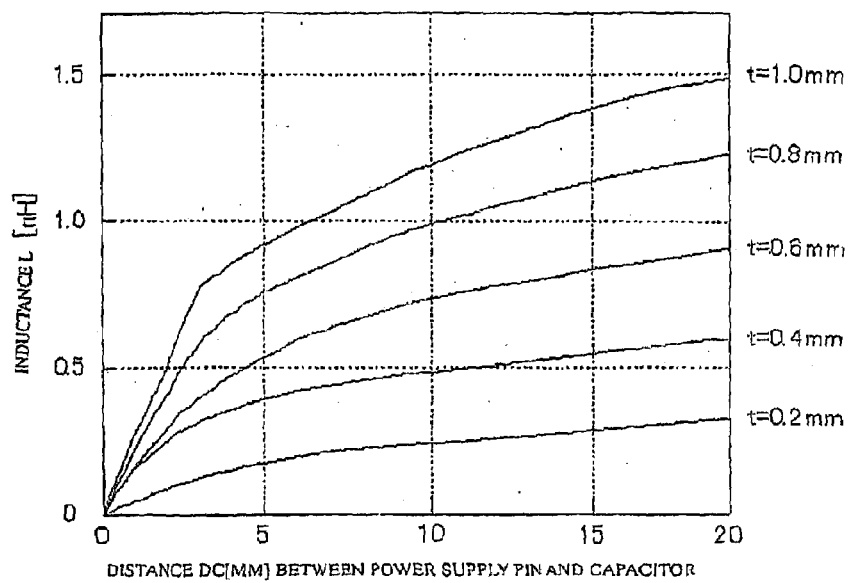
FIG. 19 is la diagram showing a relationship of the distance between a via hole and a capacitor, and an inductance, with plane spacing as a parameter.

FIG. 18C shows one in which the structure of FIG. 18A is expressed with the use of an equivalent circuit. This equivalent circuit connects the power planes 54 and the ground planes 55 of the LSI, IC, 51, and is composed of a capacitance C of the capacitors 53, a parasitic inductance component Lcap 57 caused by the capacitors and mounting the, capacitors, and an inductance component Lpcb 56 caused by the fact that the power source pins 52 of the LSI 51 and the capacitors are separated in distance FIG. 19 is a diagram showing the relationship between the distance between via holes and capacitors and the inductance, with plane spacing as a parameter.

This is a diagram showing distance dependency between the power source pins 52 and the capacitors 53 of the inductance component Lpcb, with spacing t between the power planes and the ground planes as a parameter. The inductance component Lpcb 56 depends on the distance dc between the power source pins 52 of the LSI and the capacitors 53, the spacing t between both of the power planes 54 and the ground planes 55 of the printed circuit board, on top of that, dielectric material comprising a plane and a board.

Incidentally, when the LSI performs switching operation, a current I flows into the power source pins 52 of the LSI 51 at once, as shown in FIG. 18C. This current I causes such power supply voltage variation ?V as shown by ?V=Lpcb, dI/dt on both ends of the inductance component Lpcb 56.

The generation of the voltage variation causes temporary power supply voltage variation between the power supply and the ground of the LSI 51, often leading to circuit malfunction such as a delay in signal rise-time, and timing disorder.

Figure 20A:
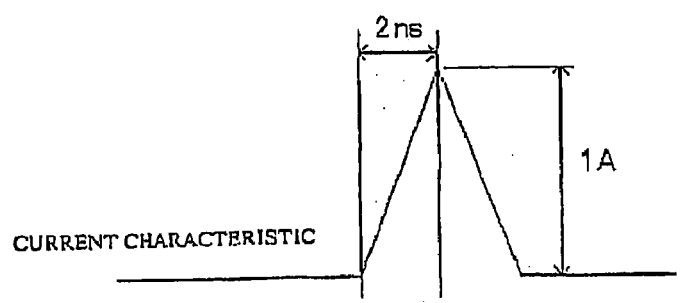
FIG. 20A is a diagram showing a current waveform flowing through a power supply side in switching of LSI.
Figure 20B:
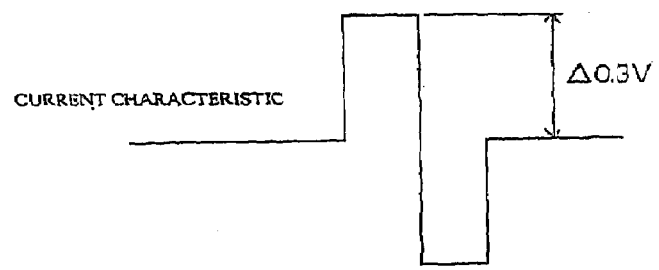
FIG. 20B is a diagram showing a voltage waveform occurring at both ends of an inductance.
Figure 20C:
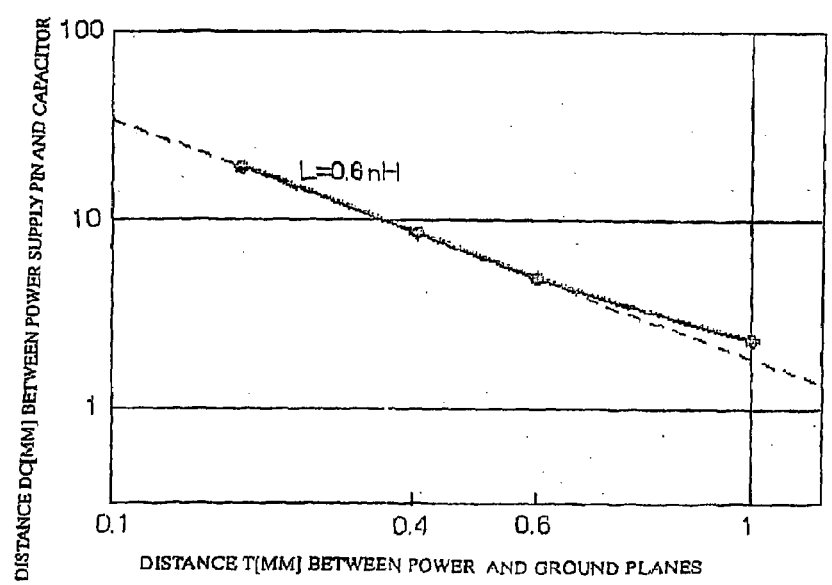
FIG. 20C is a diagram showing a relationship between the spacing between power supply and ground planes, and the distance between a power source pin and a capacitor to obtain each inductance, value.

FIG. 20A is a diagram showing the waveform of a current flowing into a power supply side in switching of the LSI. FIG. 20B is a diagram showing the waveform of voltages occurring on both ends of the inductance. FIG. 20C is a diagram showing the relationship between the spacing between the power planes and the ground planes and the distance between the power source pins and the capacitors to obtain each inductance value.

In many cases, the current I flowing into the power source pins 52 of the LSI 51 in switching of the LSI is of such a triangular wave form as shown in FIG. 20A, and the voltages occurring on both ends of the inductance component Lpcb 56 is of a waveform close to such a rectangular shape as shown in FIG. 20B. The amplitude of the voltage at this time point is proportional to the inductance component Lpcb 56.

Conversely, in order to control the voltage variation within the regulation range, the inductance component Lpcb 56 requires to be reduced. For example, voltage variation when the rise-time is 2 ns and a current of amplitude 1A flows is 0.25 [V] in Lpcb=0.5 nH, and 0.5 [V] in Lpcb=1.0 nHX.

A tolerable power supply voltage variation value depends on a power supply voltage. For example, in the case of a power supply voltage of 3.3 V, in order to limit a tolerable value of the power supply voltage variation up to less than about its 10%, ?V=0.3 V, it is necessary to make the inductance component Lpcb 56 not more than 0.6 nH.

The distance dc between the power source pins 52 and the capacitors 53 in which the inductance component Lpcb 56 is of 0.6 nH may be expressed by such a relationship as shown in FIG. 20C with respect to the spacing t between the power planes and the ground planes.

If is possible to determine the arrangement position of a capacitor for making power supply voltage variation of an intended power supply line not more than the regulation range by having a database containing this relationship.

Said database is allowed to have as a table shown below. In addition, the plane spacing t and the tolerable distance value dp between the via holes and the capacitors may be represented in a substantially straight line by expressing both axes as logarithms, and thus are enabled to be formulated by such a simple equation as shown in dp=C×t−D (provided that C and D are constants).

TABLE 2

Tolerable distance value dp [mm] between the power source pins and the capacitors to obtain Lpcb)

| Plane spacing t | Inductance component Lpcb | | |
|---|---|---|---|
| | 0.4 nH | 0.6 nH | ... |
| t1 | 12 | 18 | . |
| t2 | 4 | 6 | . |
| t3 | 2.5 | 4 | . |
| . | . | . | . |
| . | . | . | . |
| . | . | . | . |

The embodiments described above may include anti-unnecessary electromagnetic wave radiation control from a design stage of the printed circuit board.

In addition, there is provided an effect to control circuit malfunction by promoting the optimization of a board layout, while maintaining a design technique and the structure of a conventional board.

Figure 21:
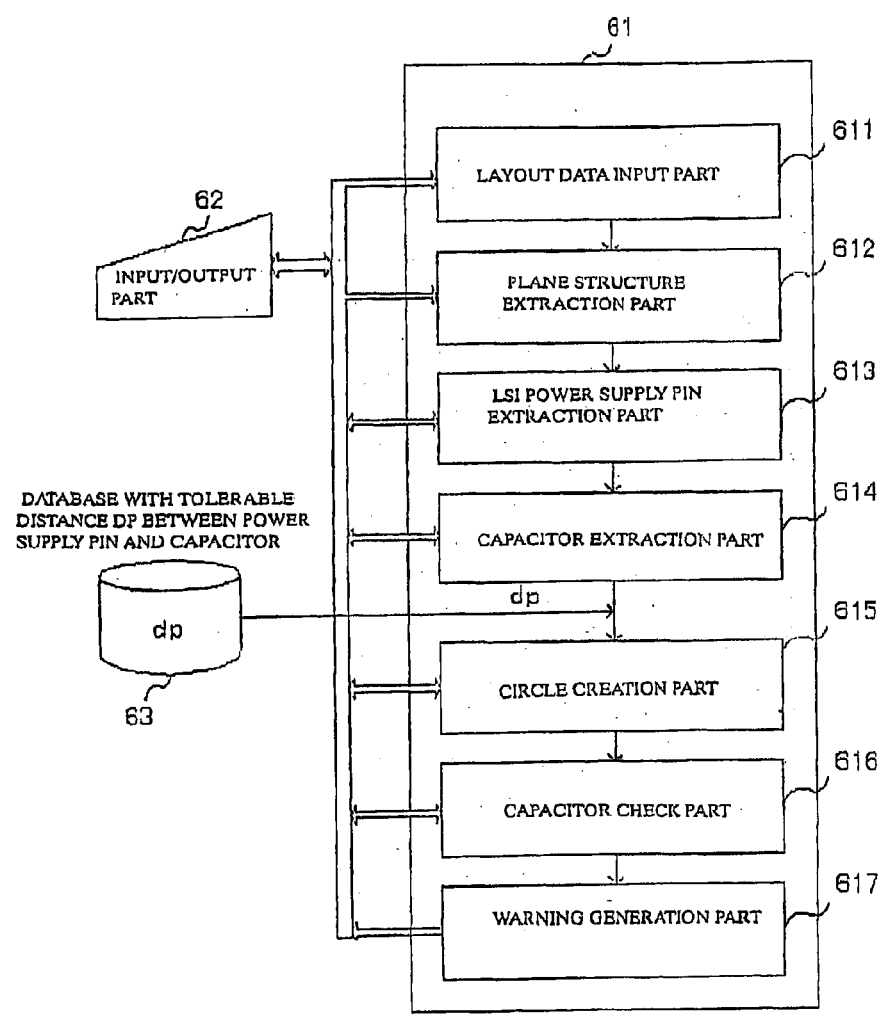
FIG. 21 is a block diagram showing the configuration of a printed circuit wiring board design supporting device in accordance with a first modification of the second embodiment of the present invention.
Figure 22:
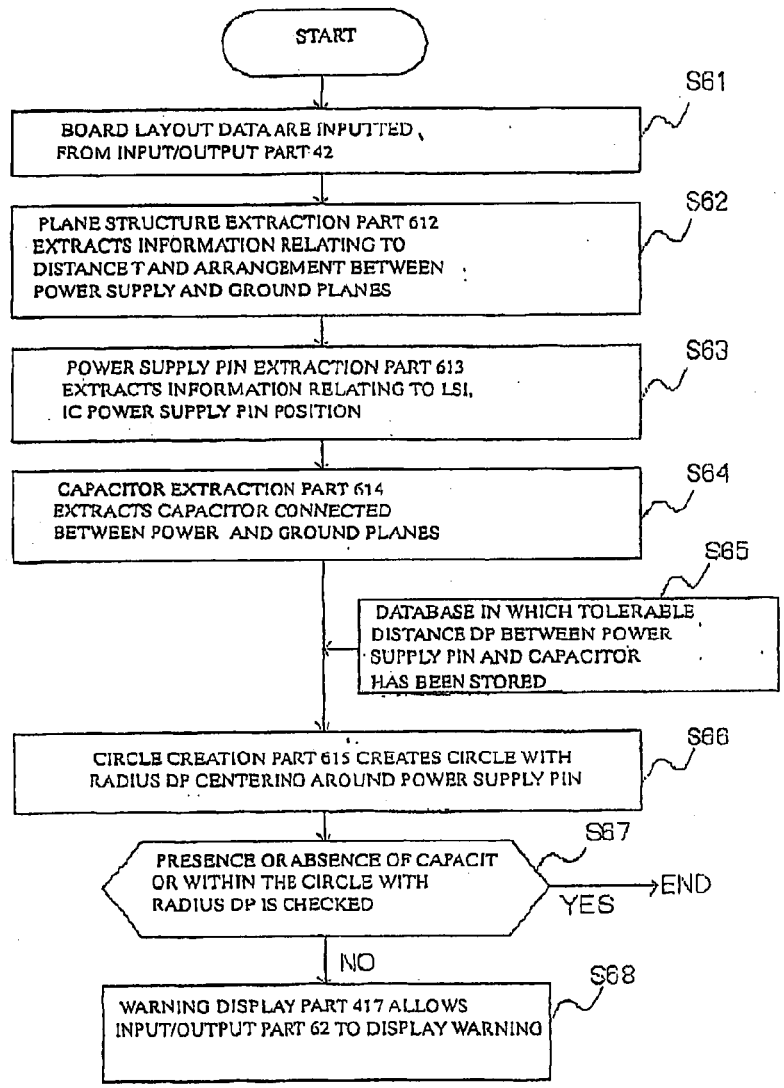
FIG. 22 is a flowchart showing a printed circuit wiring board design method in accordance with a printed circuit wiring board design supporting device having the configuration of FIG. 21.
Figure 23:
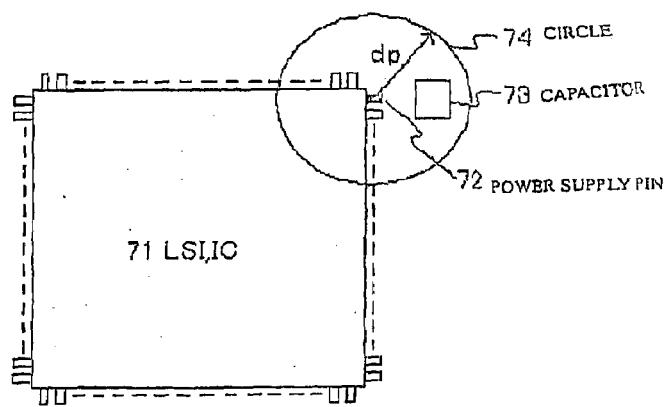
FIG. 23 is a diagram showing the arrangement of LSI, a power source pin thereof, and a capacitor mounted on a printed circuit board.

FIG. 21 is a block diagram showing the configuration of a printed circuit wiring board design supporting device in accordance with a first modification of the second embodiment of the present invention. FIG. 22 is a flowchart showing a printed circuit wiring board design method in accordance with a printed circuit wiring board design supporting device having the configuration of FIG. 21. FIG. 23 is a diagram showing the arrangement of LSI, a power source pin thereof, and a capacitor mounted on a printed circuit board.

Referring to FIG. 21 and FIG. 18A to FIG. 18C together, this printed circuit board design supporting device comprises a control part 61 operating under the control of the CPU (not shown), an input/output part 62 provided with a key input part and a display part, and an external storage device 63 for storing a database described later.

The control part 61 includes a layout data input part 611, a plane structure extraction part 612, a power source pin extraction part 613 of an LSI 71, a capacitor extraction part 614, a database 63, a circle creation part 615, a capacitor check part 616, and a warning generation part 617.

The layout data input part 611 inputs the layout data of the printed circuit board indicating each arrangement position for the case of mounting the structure of the signal wiring, the power planes, and the ground planes, the spacing between the both planes, the active element such as the LSI, IC, and the passive element such as the decoupling capacitor on a printed circuit board having the signal wiring, the power planes, and the ground planes through the input/output part 62.

The plane structure extraction part 612 extracts the structure of the power planes and the ground planes.

The power source pin extraction part 613 of the LSI extracts information relating to the position of the power source pins 52 or 72.

The capacitor extraction part 614 extracts the capacitors 53 or 73 connected between the power planes 54 and the ground planes 55.

The database 63 is a record of a tolerable distance value dp between the power source pins 72 and the capacitors 73.

The circle creation part 615 has a function to create a circle 74 with a tolerable distance value of dp outputted from a database 63 as a radius centering around the power source pins 72.

The capacitor check part 616 checks to see if said capacitors 73 are present within the circle 74 created.

The warning generation part 617 has a function to generate a warning if the capacitors 73 are not present within the circle 71.

Next, a description will be given of details of each component of a printed circuit wiring board design supporting device 61 and its operation. Position information and each interlayer spacing information relating to the structure of the power planes and the ground planes, signal wiring structure, via holes connected across both of the power planes and the ground planes, the capacitors which are connected to both of the power planes and the ground planes, and are disposed close to the via holes, and active elements such as a driver IC and a receiver IC are automatically or manually inputted in the layout data input part 611 of the printed circuit wiring board design supporting device 61 (Processing S61).

The plane structure extraction part 612 of the power planes 54 and the ground planes 55 extracts the information relating to the distance t and the arrangement between the power planes 54 and the ground planes 55 (Processing S62).

The power source pin extraction part 613 of the LSI 71 extracts information relating to the position of the power source pins 72 of each pin of the LSI, IC 71 (Processing S63).

The capacitor extraction part 614 between the power planes 54 and the ground planes 55 extracts the information relating to the position at which the capacitors connected between the power planes 54 and the ground planes 55 through the capacitor mounting pads and the capacitor connection via holes are mounted (Processing S64).

The database 63 in which the distance between the power source pins 72 and the capacitors 73 is recorded is a table in which a tolerable distance value dp which denotes the maximum value of the distance between the power source pins 72 and the capacitors 73 to obtain an equivalent inductance Lpcb which is tolerable in the light of power supply voltage variation control is recorded with respect to the spacing t between both of the power planes 54 and the ground planes 55 (Processing S65).

Referring to FIG. 23 showing the arrangement of the LSI 71, the power source pins 72 thereof, and the capacitors 73 which are mounted on the printed circuit board, in the circle creation part 615, a board layout drawing is created with the use of layout data obtained in the layout data input part 611 to depict the circle 74 with a tolerable distance value of dp outputted from the database 63 as a radius centering around the power source pins 72 on this drawing (Processing S66).

Furthermore, the capacitor check part 616 checks to see if the capacitors are present within the depicted circle (Processing S67). If the capacitors are not present, a warning and the reason for generating the warning are displayed (Processing S68).

Figure 24:
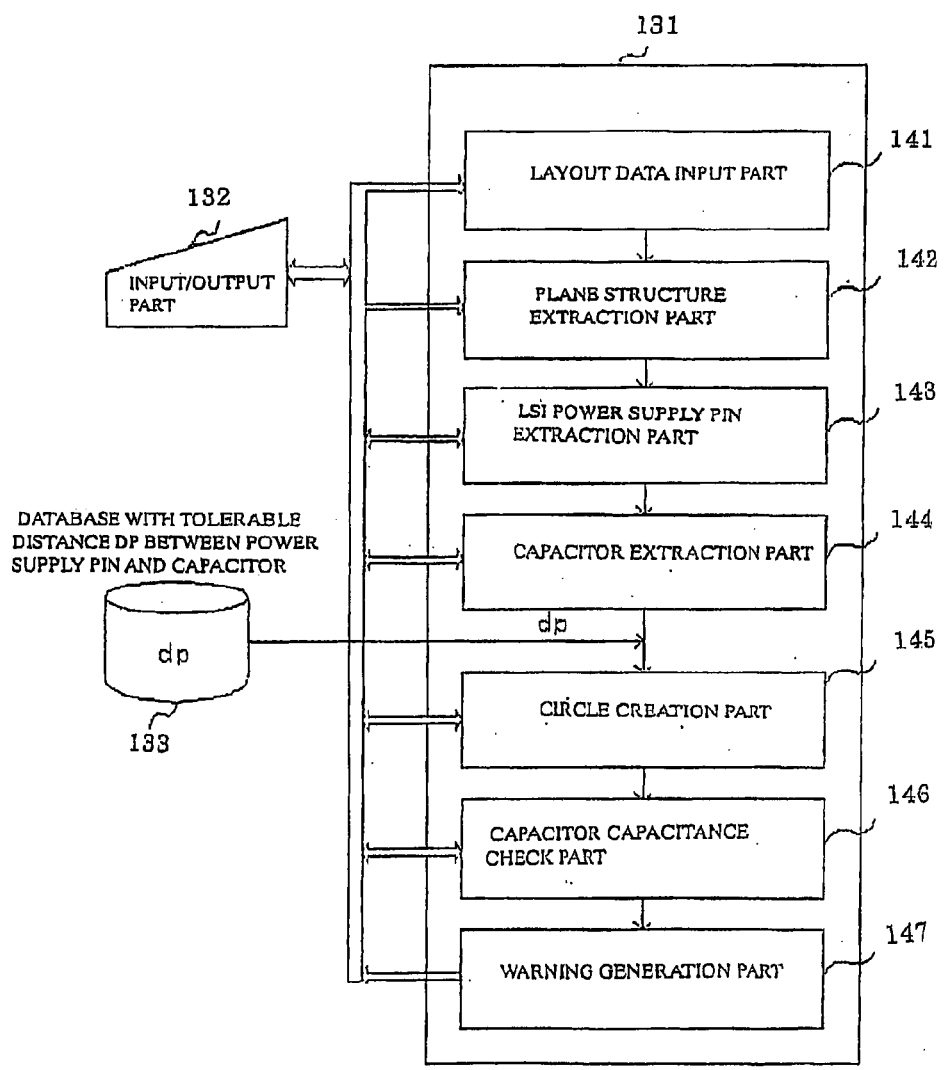
FIG. 24 is a block diagram showing the configuration of a printed circuit wiring board design supporting device in accordance with a second modification of the second embodiment of the present invention.
Figure 25:
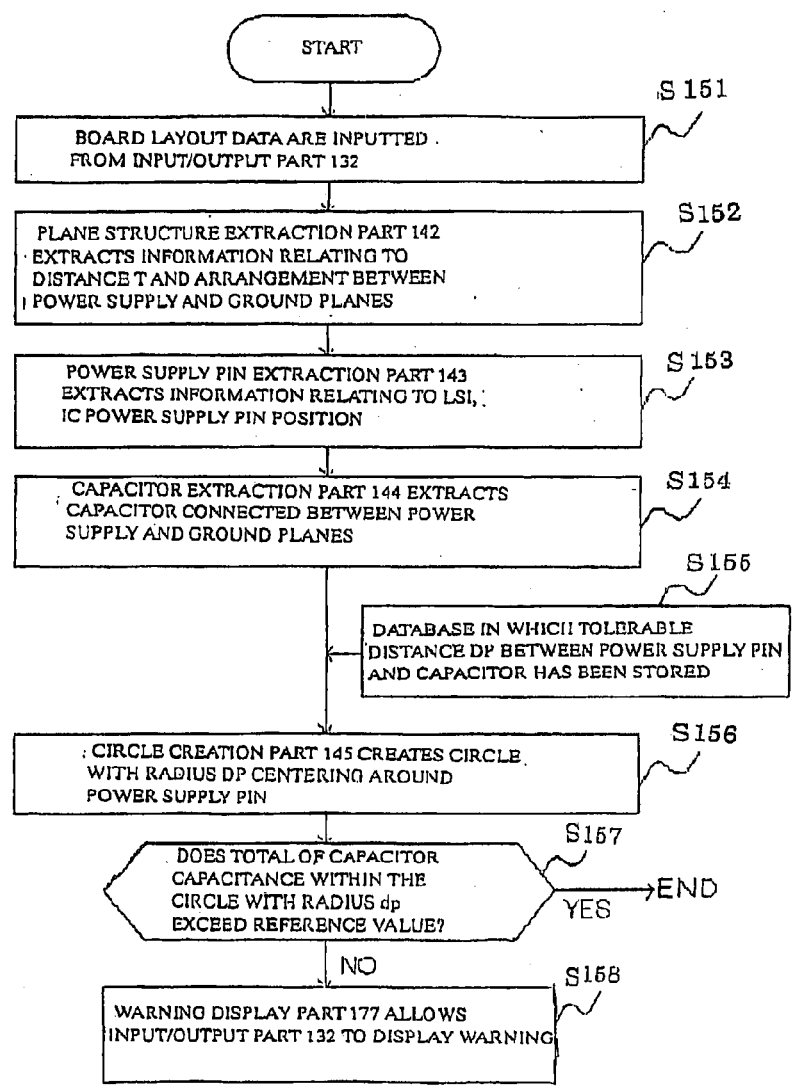
FIG. 25 is a flowchart showing a printed circuit wiring board design method in accordance with a printed circuit wiring board design supporting device having the configuration of FIG. 24.

FIG. 24 is a block diagram showing the configuration of a printed circuit wiring board design supporting device in accordance with a second modification of the second embodiment of the present invention. FIG. 25 is a flowchart showing a printed circuit wiring board design method in accordance with a printed circuit wiling board design supporting device having the configuration of FIG. 24.

Referring to FIG. 24 and FIG. 25, the printed circuit board design supporting device comprises a control part 131 operating under the control of the CPU (not shown), an input/output part 132 provided with a key input part and a display part, and external storage device 133 for storing a database described later.

The control part 131 includes a layout data input part 141, a plane structure extraction part 142, a power source pin extraction part 143 of LSI, a capacitor extraction part 144, a database 133, a circle creation part 145, a capacitor capacitance calculation part 146, and a warning generation part 147.

The layout data input part 141 inputs the layout data of the printed circuit board indicating each arrangement position for the case of mounting the structure of the signal wiring, the power planes, and the ground planes, the spacing between the both planes, the active element such as the LSI, IC, and the passive element such as the decoupling capacitor on the printed circuit board having the signal wiring, the power planes, and the ground planes through the input/output part 132.

The plane structure extraction part 142 extracts the structure of the power planes and the ground planes.

The power source pin extraction part 143 of the LSI extracts information relating to the position of the power source pins.

The capacitor extraction part 144 extracts the capacitors connected between the power planes 54 and the ground planes 55.

The database 133 is a storage device in which the tolerable distance value dp between the power source pins and the capacitors, and a capacitance reference value $C_{ref}$ are recorded.

The circle creation part 145 has a function to create a circle with a tolerable distance value of dp outputted from database 133 as a radius centering around the power source pins.

The capacitor capacitance check part 146 chocks to see if a total $C_{total}$ of capacitance values of all capacitors present within the created circle is calculated, and checks to see if the total $C_{total}$ of the capacitance values exceeds the capacitance, reference value $C_{ref}$.

The warning generation part 617 has a function to generate a warning if the total $C_{total}$ of the capacitance values does not exceed the capacitance reference value $C_{ref}$.

Next, a description will be given of details of each component of a printed circuit wiring board design supporting device 131 and its operation. The position information and each interlayer spacing information relating to the structure of the power planes and the ground planes, the signal wiring structure, the visa holes connected across both of the power planes and the ground planes, the capacitors which are connected to both of the power planes and the ground planes, and are disposed close to the via holes, and the active elements such as the driver IC and the receiver IC are automatically or manually inputted in the layout data input part 141 of the printed circuit board (Processing S151).

The plane structure extraction part 142 of the power planes 54 and the ground planes 55 extracts the information relating to the distance t and the arrangement between the power planes 54 and the ground planes 55 (Processing S152).

The power source pin extraction part 14 of the LSI 71 extracts the information relating to the position of the power source pins 72 of each pin of the LSI, IC 71, as shown in FIG. 23 (Processing S153).

The capacitor extraction part 144 between the power planes 54 and the ground planes 55 extracts the information relating to the position at which the capacitors connected between the power planes 54 and the ground planes 55 through the capacitor mounting pads and the capacitor connection via holes are mounted (Processing S154).

The database 63 in which the distance between the power source pins 72 and the capacitors 73 is recorded is a table in which the tolerable distance value dp which denotes the, maximum value of the distance between the power source pins 72 and the capacitors 73 to obtain the equivalent inductance Lpcb which is tolerable in the light of the power supply voltage variation control is recorded with respect to the spacing t between both of the power planes 54 and the ground planes 55 (Processing S155).

Referring to FIG. 23 showing the arrangement of the LSI 71, the power source pins thereof, and the capacitors 73 which are mounted on the printed circuit board, in the circle creation part 145, a board layout drawing is created with the use of layout data obtained in the layout data input part 141 to depict the circle 74 with a tolerable distance value of dp outputted from the database 133 as a radius centering around the power source pins 72 on this drawing (Processing S156).

Moreover, the capacitor capacitance check part 146 checks to see if the total $C_{total}$ of the capacitance values of all capacitors present within the depicted circle is calculated, and checks to see if the total $C_{total}$ of the capacitance values exceeds the capacitance reference value $C_{ref}$ (Processing S157).

If the total $C_{total}$ of the capacitance values does not exceed the capacitance reference value $C_{ref}$, a warning and tie reason for generating the warning are displayed (Processing S158).

The embodiments described above may also include the anti-unnecessary electromagnetic wave radiation control from the design stage of the printed circuit board.

In addition, there is provided an effect to control the circuit malfunction by promoting the optimization of the board layout, while maintaining the design technique and the structure of the conventional board.

In accordance with the printed circuit wiring board design supporting device and the printed circuit board design method of the present invention, a distance check part compares the distance dc and the tolerable distance value dp between the via holes and the capacitors with respect to the spacing t between both of the power planes and the ground planes based on the layout data of the printed circuit board in reference to a table in which a tolerable distance value dp which is tolerable in the light of an unnecessary electromagnetic wave radiation-controlling effect and the maximum value of the distance between the via holes and the capacitors is recorded as a database. And, in the case of dc>dp, the warning generation part displays a warning and the reason for generating the warning, thus enabling the anti-unnecessary electromagnetic wave radiation control to be included from the design stage of the printed circuit board.

In addition, when capacitors are present within a circle with a radius of dp centering around the power source pins in reference to a table of tolerable distance dp between the power source pins and the capacitors, when the required number of capacitors is not disposed within the circle with a radius of dp centering around the power source pins in reference to a table in which the relationship between the tolerable distance dp between the power source pins and the capacitors and the required number of the capacitors is recorded, when the distance between the power source pins and the capacitors exceeds the tolerable distance, and when no capacitors are present within the tolerable distance between the power source pins and the capacitors, warnings and the reasons for generating the warnings are displayed, respectively, thus enabling the anti-unnecessary electromagnetic wave radiation control to be included from the design stage of the printed circuit board.

In addition, there is provided an effect to control the circuit malfunction by promoting the optimization of the board layout, while maintaining the design technique and the structure of the conventional board.

In the embodiments described above, the printed circuit wiring board design supporting device may comprise including a database, but may be composed of hardware capable of storing or holding information or data in place of being composed of a database. Furthermore, the printed circuit wiring board design supporting device may comprise incorporating the data or the information stored in the above database into a program as software in place of reading out of the database or storage hardware.

Still furthermore, it is to be understood that each part making up the printed circuit wiring board design supporting device strictly comprises function units for performing the aforementioned functions, and is not limited to a specific configuration such as hardware or software.

Yet furthermore, a ground plane means at least conductor structure having two-dimensional plane spread which is fixed to reference potential different from power supply potential, and all that the reference potential needs is to be different from the power supply potential, and is not limited to 0V.

INDUSTRIAL APPLICABILITY

It is to be understood that the present invention is applicable to anything that relates to a printed circuit wiring board design supporting device, a printed circuit board design method, and a program of the same, and is not intended to be limited in its applicability.

While the present invention has been described in relation to some preferred embodiments and exemplary embodiments, it is to be understood that these embodiments and exemplary embodiments are for the purpose of description by example, and not of limitation. While it will be obvious to those skilled in the art upon reading the present specification that various changes and substitutions may be easily made by equal components and arts it is obvious that such changes and substitutions lie within the true scope and spirit of the appended claims.

The invention claimed is:

1. A printed circuit wiring board design supporting device comprising, in order to design a printed circuit board including signal wiring, power planes, and ground planes:
   a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board;
   a plane structure extraction part for extracting the structure of said power planes and said ground planes;
   a via hole extraction part for extracting via holes for interconnecting wiring extending at different levels to each other across said power planes and said ground planes;
   a capacitor extraction part for extracting capacitors connected between said power planes and said ground planes;
   a measurement part for measuring the distance between said via holes and said capacitors;
   a distance comparison part for comparing the upper limit of a tolerable distance range between said via holes and said capacitors to measurement distance between said via holes and said capacitors, which is measured by said measurement part, with respect to the spacing between said power planes and said ground planes; and
   a warning generation part for generating a warning if said measurement distance is larger than the upper limit of said tolerable distance range.

2. The printed circuit wiring board design supporting device according to claim 1,
   wherein the upper limit of said tolerable distance range is displayed as a table.

3. The printed circuit wiring board design supporting device according to claim 1,
   wherein the upper limit of said tolerable distance range is displayed as a mathematical formula.

4. A printed circuit wiring board design supporting device comprising, in order to design a printed circuit board including signal wiring, power planes, and ground planes:
   a layout data input part for inputting layout data including stricture data of said signal wiring, structure data of said power planes, structure data of said ground planes, spacing data between said power planes and said ground planes, and mounting position data of at least one of an active element and a passive element which are mounted on said printed circuit board;
   a plane structure extraction part for extracting the structure of said power planes and said ground planes;
   a via hole extraction part for extracting via holes for interconnecting wiring extending at different levels to each other across said power planes and said ground planes;
   a capacitor extraction part for extracting capacitors connected between said power planes and said ground planes;
   a circle creation part for creating a circle with the upper lint of a tolerable distance range between said via holes and said capacitors as a radius centering around said via holes with respect to the spacing between said power planes and said ground planes;
   a capacitor check part for checking to see if said capacitors are present within said circle; and
   a warning generation part for generating a warning if the capacitors are not present within said circle.

5. A printed circuit wiring board design supporting device comprising, in order to design a printed circuit board including signal wiring, power planes, and ground planes:
   a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board;
   a plane structure extraction part for extracting the structure of said power planes and said ground planes;
   a via hole extraction part for extracting via holes for interconnecting wiring extending at different levels to each other across said power planes and said ground planes;
   a capacitor extraction part for extracting capacitors connected between said power planes and said ground planes;
   a circle creation part for creating a circle with the upper limit of a tolerable distance range between said via holes and said capacitors as a radius centering around said via holes with respect to the spacing between said power planes and said ground planes;
a capacitor number check part for counting the number of said capacitors within said circle to compare the counted number thereof to the number of capacitors required for the upper limit of the tolerable distance range; and
a warning generation part for generating a warning if the capacitors within said circle do not meet the required number.

6. A printed circuit wiring board design supporting device comprising, in order to design a printed circuit board including signal wiring, power planes, and ground planes:
   a layout data input part for inputting layout data including structure data of said signal wiring, structure data of said power planes, structure data of said ground planes, spacing data between said power planes and said ground planes, and mounting position data of at least one of an active element arid a passive element which are mounted on said printed circuit board;
   a plane structure extraction part for extracting the structure of said power planes and said ground planes;
   a power source pin extraction part for extracting power source pins for an integrated circuit mounted on said printed circuit board;
   a capacitor extraction part for extracting capacitors connected between said power planes and said ground planes;
   a measurement part for measuring the distance between said power source pins and said capacitors;
   a distance comparison part for comparing measurement distance between said power source pins and said capacitors, which is measured by said measurement part, to the upper limit of a tolerable distance range between said power source pins and said capacitors with respect to the spacing between said power planes and said ground planes; and
   a warning generation part for generating a warning if said measurement distance is larger than the upper limit of said tolerable distance range.

7. The printed circuit wiring board design supporting device according to claim 6,
   wherein the upper limit of said tolerable distance range is displayed as a table.

8. The printed circuit wiring board design supporting device according to claim 6,
   wherein the upper limit of said tolerable distance range is displayed as a mathematical formula.

9. A printed circuit wiring board design supporting device comprising, in order to design a printed circuit board including signal wiring, power planes, and ground planes:
   a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board;
   a plane structure extraction part for extracting the structure of said power planes and said ground planes;
   a power source pin extraction part for extracting power source pins for an integrated circuit mounted on said printed circuit board;
   a capacitor extraction part for extracting capacitors connected between said power planes and said ground planes;
   a circle creation part for creating a circle with the upper limit of a tolerable distance range between said power source pins and said capacitors as a radius centering around said power source pins with respect to the spacing between said power planes and said ground planes;
   a capacitor check part for checking to see if said capacitors are present within said circle; and
   a warning generation part for generating a warning if the capacitors are not present within said circle.

10. A printed circuit wiring board design supporting device comprising in order to design a printed circuit board including signal wiring, power planes, and ground planes:
    a layout data input part for inputting layout data including structure data of said signal wiring, structure data of said power planes, structure data of said ground planes, spacing data between said power planes and said ground planes, and mounting position data of at least one of an active element and a passive element which are mounted on said printed circuit board;
    a plane structure extraction part for extracting the structure of said power planes and said ground planes;
    a power source pin extraction part for extracting power source pins for an integrated circuit mounted on said printed circuit board;
    a capacitor extraction part for extracting capacitors connected between said power planes and said ground planes;
    a circle creation part for creating a circle with the upper limit of a tolerable distance range between said power source pins and said capacitors as a radius centering around said power source pins with respect to the spacing between said power planes and said ground planes;
    a capacitor capacitance check part for checking to see if the total of capacitance values of all capacitors present within said circle exceeds a reference value; and
    a warning generation part for generating a warning if the total of said capacitance values does not exceed said reference value.

11. A printed circuit wiring board design method comprising, in order to design a printed circuit board including signal wiring, power planes, and ground planes:
    a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;
    a plane structure extraction step of extracting the structure of said power planes and said ground planes;
    a via hole extraction step of extracting via holes for interconnecting wiring extending at different levels to each other across said power planes and said ground planes;
    a capacitor extraction step of extracting capacitors connected between said power planes and said ground planes;
    a measurement step of measuring the distance between said via holes and said capacitors;
    a distance comparison step of comparing the upper limit of a tolerable distance range between said via holes and said capacitors to measurement distance between said via holes and said capacitors, which is measured by said measurement step, with respect to the spacing between said power planes and said ground planes; and a warning generation step of generating a warning if said measurement distance is larger than the upper limit of said tolerable distance range.

12. The printed circuit wiring board design method according to claim 11,
wherein the upper limit of said tolerable distance range is displayed as a table.

13. The printed circuit wiring board design method according to claim 11,
wherein the upper limit of said tolerable distance range is displayed as a mathematical formula.

14. A printed circuit wiring board design method comprising, in order to design a printed circuit board including signal wiring, power planes, and ground planes:
a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;
a plane structure extraction step of extracting the structure of said power planes and said ground planes;
a via hole extraction step of, extracting via holes for interconnecting wiring extending at different levels to each other across said power planes and said ground planes;
a capacitor extraction step of extracting capacitors connected between said power planes and said ground planes;
a circle creation step of creating a circle with the upper limit of a tolerable distance range between said via holes and said capacitors as a radius centering around said via holes with respect to the spacing between said power planes and said ground planes;
a capacitor check step of checking to see if said capacitors are present within said circle; and
a warning generation step of generating a warning if the capacitors are not present within said circle.

15. A printed circuit wiring board design method comprising, in order to design a printed circuit board including signal wiring, power planes, and ground planes:
a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;
a plane structure extraction step of extracting the structure of said power planes and said ground planes;
a via hole extraction step of extracting via holes for interconnecting wiring extending at different levels to each other across said power planes and said ground planes;
a capacitor extraction step of extracting capacitors connected between said power planes and said ground planes;
a circle creation step of creating a circle with the upper limit of a tolerable distance range between said via holes and said capacitors as a radius centering around said via holes with respect to the spacing between said power planes and said ground planes;
a capacitor number check step of counting the number of said capacitors within said circle to compare the counted number thereof to the number of capacitors required for the upper limit of the tolerable distance range; and
a warning generation step of generating a warning if the capacitors within said circle do not meet the required number.

16. A printed circuit wiring board design method comprising, in order to design a printed circuit board including signal wiring, power planes, and ground planes:
a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;
a plane structure extraction step of extracting the structure of said power planes and said ground planes;
a power source pin extraction step of extracting power source pins for an integrated circuit mounted on said printed circuit board;
a capacitor extraction step of extracting capacitors connected between said power planes and said ground planes;
a measurement step of measuring the distance between said power source pins and said capacitors;
a distance comparison step of comparing measurement distance between said power source pins and said capacitors, which is measured by said measurement step, to the upper limit of a tolerable distance range between said power source pins and said capacitors with respect to the spacing between said power planes and said ground planes; and
a warning generation step of generating a warning if said measurement distance is larger than the upper limit of said tolerable distance range.

17. The printed circuit wiring board design method according to claim 16,
wherein the upper limit of said tolerable distance range is displayed as a table.

18. The printed circuit wiring board design method according to claim 16,
wherein the upper limit of said tolerable distance range is displayed as a mathematical formula.

19. A printed circuit wiring board design method comprising, in order to design a printed circuit board including signal wiring, power planes, and ground planes:
a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;
a plane structure extraction step of extracting the structure of said power planes and said ground planes;
a power source pin extraction step of extracting power source pins for an integrated circuit mounted on said printed circuit board;
a capacitor extraction step of extracting capacitors connected between said power planes and said ground planes;
a circle creation step of creating a circle with the upper limit of a tolerable distance range between said power source pins and said capacitors as a radius centering around said power source pins with respect to the spacing between said power planes and said ground planes;

a capacitor check step of checking to see if said capacitors are present within said circle; and a warning generation step of generating a warning if the capacitors are not present within said circle.

20. A printed circuit wiring board design method comprising, in order to design a printed circuit board including signal wiring, power planes, and ground planes:

a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;

a plane structure extraction step of extracting the structure of said power planes and said ground planes;

a power source pin extraction step of extracting power source pins for an integrated circuit mounted on said printed circuit board;

a capacitor extraction step of extracting capacitors connected between said power planes and said ground planes;

a circle creation step of creating a circle with the upper limit of a tolerable distance range between said power source pins and said capacitors as a radius centering around said power source pins with respect to the spacing between said power planes and said ground planes;

a capacitor capacitance check step of checking to see if the total of capacitance values of all capacitors present within said circle exceeds a reference value; and a warning generation step of generating a warning if the total of said capacitance values does not exceed said reference value.

21. A computer-readable medium having stored thereon instructions which, when executed by a computer, perform steps, to design a printed circuit board including signal wiring, power planes, and ground planes comprising:

a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;

a plane structure extraction step of extracting the structure of said power planes and said ground planes;

a via hole extraction step of extracting via holes for interconnecting wiring extending at different levels to each other across said power planes and said ground planes;

a capacitor extraction step of extracting capacitors connected between said power planes and said ground planes;

a measurement step of measuring the distance between said via holes and said capacitors;

a distance comparison step of comparing the upper limit of a tolerable distance range between said via holes and said capacitors to measurement distance between said via holes and said capacitors, which is measured by said measurement step, with respect to the spacing between said power planes and said ground planes; and a warning generation step of generating a warning if said measurement distance is larger than the upper limit of said tolerable distance range.

22. The computer-readable medium according to claim 21, wherein the upper limit of said tolerable distance range is displayed as a table.

23. The computer-readable medium according to claim 21, wherein the upper limit of said tolerable distance range is displayed as a mathematical formula.

24. A computer-readable medium having stored thereon instructions which, when executed by a computer, perform steps, to design a printed circuit board including signal wiring, power planes, and ground planes comprising:

a layout data input step of inputting layout data including structure data of said signal wiring, structure data of said power planes, structure data of said ground planes, spacing data between said power planes and said ground planes, and mounting position data of at least one of an, active element and a passive element which are mounted on said printed circuit board;

a plane structure extraction step of extracting the structure of said power planes and said ground planes;

a via hole extraction step of extracting via holes for interconnecting wiring extending at different levels to each other across said power planes and said ground planes;

a capacitor extraction step of extracting capacitors connected between said power planes and said ground planes;

a circle creation step of creating a circle with the upper limit of a tolerable distance range between said via holes and said capacitors as a radius centering around said via holes with respect to the spacing between said power planes and said ground planes;

a capacitor check step of checking to see if said capacitors are present within said circle; and a warning generation step of generating a warning if the capacitors are not present within said circle.

25. A computer-readable medium having stored thereon instructions which, when executed by a computer, perform steps, to design a printed circuit board including signal wiring, power planes, and ground planes comprising:

a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;

a plane structure extraction step of extracting the structure of said power planes and said ground planes;

a via hole extraction step of extracting via holes for interconnecting wiring extending at different levels to each other across said power planes and said ground planes;

a capacitor extraction step of extracting capacitors connected between said power planes and said ground planes;

a circle creation step of creating a circle with the upper limit of a tolerable distance range between said via holes and said capacitors as a radius centering around said via holes with respect to the spacing between said power planes and said ground planes;

a capacitor number check step of counting the number of said capacitors within said circle to compare the counted number thereof to the number of capacitors required for the upper limit of the tolerable distance range; and a warning generation step of generating a warning if the capacitors within said circle do not meet the required number.

26. A computer-readable medium having stored thereon instructions which, when executed by a computer, perform steps, to design a printed circuit board including signal wiring, power planes, and ground planes comprising:

a layout data input step of inputting lay out data including structure data of said signal wiring structure data of said power planes, structure data of said ground planes, spacing data between said power planes and said ground planes, and mounting position data of at least one of an active element and a passive element which are mounted on said printed circuit board;

a plane structure extraction step of extracting the structure of said power planes and said ground planes;

a power source pin extraction step of extracting power source pins for an integrated circuit mounted on said printed circuit board;

a capacitor extraction step of extracting capacitors connected between said power planes and said ground planes;

a measurement step of measuring the distance between said power source pins and said capacitors;

a distance comparison step of comparing measurement distance between said power source pins and said capacitors, which is measured by said measurement step, to the upper limit of a tolerable distance range between said power source pins and said capacitors with respect to the spacing between said power planes and said ground planes; and a warning generation step of generating a warning if said measurement distance is larger than the upper limit of said tolerable distance range.

27. The computer-readable medium according to claim 26,
wherein the upper limit of said tolerable distance range is displayed as a table.

28. The computer-readable medium according to claim 26,
wherein the upper limit of said tolerable distance range is displayed as a mathematical formula.

29. A computer-readable medium having stored thereon instructions which, when executed by a computer, perform steps, to design a printed circuit board including signal wiring, power planes, and ground planes comprising:

a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;

a plane structure extraction step of extracting the structure of said power planes and said ground planes;

a power source pin extraction step of extracting power source pins for an integrated circuit mounted on said printed circuit board;

a capacitor extraction step of extracting capacitors connected between said power planes and said ground planes;

a circle creation step of creating a circle with the upper limit of a tolerable distance range between said power source pins and said capacitors as a radius centering around said power source pins with respect to the spacing between said power planes and said ground planes;

a capacitor check step of checking to see if said capacitors are present within said circle; and a warning generation step of generating a warning if the capacitors are not present within said circle.

30. A computer-readable medium having stored thereon instructions which, when executed by a computer, perform steps, to design a printed circuit board including signal wiring, power planes, and ground planes comprising:

a layout data input step of inputting layout data including structure data of said signal wiring, structure data of said power planes, structure data of said ground planes, spacing data between said power planes and said ground planes, and mounting position data of at least one of an active element and a passive element which are mounted on said printed circuit board;

a plane structure extraction step of extracting the structure of said power planes and said ground planes;

a power source pin extraction step of extracting power source pins for an integrated circuit mounted on said printed circuit board;

a capacitor extraction step of extracting capacitors connected between said power planes and said ground planes;

a circle creation step of creating a circle with the upper limit of a tolerable distance range between said power source pins and said capacitors as a radius centering around said power source pins with respect to the spacing between said power planes and said ground planes;

a capacitor capacitance check step of checking to see if the total of capacitance values of all capacitors present within said circle exceeds a reference value; and a warning generation step of generating a warning if the total of said capacitance values does not exceed said reference value.

* * * * *